(12) United States Patent
Lin et al.

(10) Patent No.: US 8,207,553 B2
(45) Date of Patent: Jun. 26, 2012

(54) SEMICONDUCTOR CHIP ASSEMBLY WITH BASE HEAT SPREADER AND CAVITY IN BASE

(75) Inventors: Charles W. C. Lin, Singapore (SG); Chia-Chung Wang, Hsinchu (TW); Sangwhoo Lim, Johor (MY)

(73) Assignee: Bridge Semiconductor Corporation, Taipei (TW)

( * ) Notice: Subject to any disclaimer, the term of this patent is extended or adjusted under 35 U.S.C. 154(b) by 230 days.

(21) Appl. No.: 12/714,421

(22) Filed: Feb. 26, 2010

(65) Prior Publication Data
US 2010/0155769 A1 Jun. 24, 2010

Related U.S. Application Data

(63) Continuation-in-part of application No. 12/616,773, filed on Nov. 11, 2009, now Pat. No. 8,067,784, which is a continuation-in-part of application No. 12/557,540, filed on Sep. 11, 2009, which is a continuation-in-part of application No. 12/557,541, filed on Sep. 11, 2009, now Pat. No. 7,948,076, which is a continuation-in-part of application No. 12/406,510, filed on Mar. 18, 2009, which is a continuation-in-part of application No. 12/616,775, filed on Nov. 11, 2009.

(60) Provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
*H01L 33/00* (2010.01)
*H01L 23/34* (2006.01)
(52) U.S. Cl. ........... 257/99; 257/707; 257/711; 257/717
(58) Field of Classification Search .................. 257/99, 257/706, 707, 711, 712, 717
See application file for complete search history.

(56) References Cited

U.S. PATENT DOCUMENTS

| | | | |
|---|---|---|---|
| 3,689,993 A | 9/1972 | Tolar | 438/380 |
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |

(Continued)

FOREIGN PATENT DOCUMENTS
JP 2005-166775 6/2005

*Primary Examiner* — Ori Nadav
(74) *Attorney, Agent, or Firm* — Jackson IPC PLLC; Demian K. Jackson

(57) ABSTRACT

A semiconductor chip assembly includes a semiconductor device, a heat spreader, a conductive trace and an adhesive. The heat spreader includes a base. A cavity extends through the adhesive into the base. The semiconductor device extends into the cavity, is electrically connected to the conductive trace and is thermally connected to the heat spreader. The adhesive extends between the cavity and the conductive trace and between the base and the conductive trace. The conductive trace is located outside the cavity and provides signal routing between a pad and a terminal.

35 Claims, 31 Drawing Sheets

U.S. PATENT DOCUMENTS

| | | | | |
|---|---|---|---|---|
| 5,644,163 | A | 7/1997 | Tsuji | 257/706 |
| 5,991,156 | A | 11/1999 | Bond et al. | 361/707 |
| 6,057,601 | A | 5/2000 | Lau et al. | 257/738 |
| 6,107,683 | A | 8/2000 | Castro et al. | 257/700 |
| 6,160,705 | A | 12/2000 | Stearns et al. | 361/704 |
| 6,162,664 | A | 12/2000 | Kim | 438/126 |
| 6,281,568 | B1 | 8/2001 | Glenn et al. | 257/684 |
| 6,313,525 | B1 | 11/2001 | Sasano | 257/704 |
| 6,453,549 | B1 | 9/2002 | Bhatt et al. | 29/837 |
| 6,495,914 | B1 | 12/2002 | Sekine et al. | 257/723 |
| 6,498,355 | B1 | 12/2002 | Harrah et al. | 257/99 |
| 6,507,102 | B2 | 1/2003 | Juskey et al. | 257/406 |
| 6,528,882 | B2 | 3/2003 | Ding et al. | 257/738 |
| 6,541,832 | B2 | 4/2003 | Coyle | 257/415 |
| 6,562,643 | B2 * | 5/2003 | Chen | 438/26 |
| 6,583,444 | B2 | 6/2003 | Fjelstad | 257/82 |
| 6,603,209 | B1 | 8/2003 | DiStefano et al. | 257/781 |
| 6,608,376 | B1 | 8/2003 | Liew et al. | 257/698 |
| 6,625,028 | B1 | 9/2003 | Dove et al. | 361/707 |
| 6,670,219 | B2 | 12/2003 | Lee et al. | 438/107 |
| 6,683,795 | B1 | 1/2004 | Yoo | 361/816 |
| 6,720,651 | B2 | 4/2004 | Gaku et al. | 257/707 |
| 6,744,135 | B2 | 6/2004 | Hasebe et al. | 257/712 |
| 6,861,750 | B2 | 3/2005 | Zhao et al. | 257/739 |
| 6,900,535 | B2 | 5/2005 | Zhou | 257/707 |
| 6,906,414 | B2 | 6/2005 | Zhao et al. | 257/704 |
| 6,936,855 | B1 | 8/2005 | Harrah | 257/88 |
| 6,949,772 | B2 * | 9/2005 | Shimizu et al. | 257/99 |
| 6,964,877 | B2 | 11/2005 | Chen et al. | 438/20 |
| 7,038,311 | B2 | 5/2006 | Woodall et al. | 257/706 |
| 7,196,403 | B2 | 3/2007 | Karim | 257/675 |
| 7,335,522 | B2 | 2/2008 | Wang et al. | 438/26 |
| 7,470,935 | B2 | 12/2008 | Lee et al. | 257/98 |
| 7,495,322 | B2 | 2/2009 | Hashimoto et al. | 257/676 |
| 7,582,951 | B2 | 9/2009 | Zhao et al. | 257/660 |
| 7,642,137 | B2 | 1/2010 | Lin et al. | 438/127 |
| 7,690,817 | B2 | 4/2010 | Sanpei et al. | 362/294 |
| 7,741,158 | B2 | 6/2010 | Leung et al. | 438/122 |
| 7,781,266 | B2 | 8/2010 | Zhao et al. | 438/123 |
| 7,808,087 | B2 | 10/2010 | Zhao et al. | 257/670 |
| 7,812,360 | B2 | 10/2010 | Yano | 257/98 |
| 7,956,372 | B2 | 6/2011 | Kamada et al. | 257/98 |
| 8,030,676 | B2 | 10/2011 | Lin | 257/99 |
| 8,071,998 | B2 | 12/2011 | Chen | 257/99 |
| 2003/0189830 | A1 | 10/2003 | Sugimoto et al. | 362/294 |
| 2004/0061433 | A1 | 4/2004 | Izuno et al. | 313/498 |
| 2004/0065894 | A1 | 4/2004 | Hashimoto et al. | 257/100 |
| 2005/0024834 | A1 | 2/2005 | Newby | 361/719 |
| 2005/0135105 | A1 | 6/2005 | Teixeira et al. | 362/294 |
| 2005/0185880 | A1 | 8/2005 | Asai | 385/14 |
| 2005/0274959 | A1 | 12/2005 | Kim et al. | 257/79 |
| 2006/0012967 | A1 | 1/2006 | Asai et al. | 361/764 |
| 2006/0054915 | A1 | 3/2006 | Chang | 257/100 |
| 2006/0109632 | A1 | 5/2006 | Berlin et al. | 361/719 |
| 2006/0131735 | A1 | 6/2006 | Ong et al. | 257/706 |
| 2007/0063213 | A1 | 3/2007 | Hsieh et al. | 257/99 |
| 2007/0077416 | A1 | 4/2007 | Ito et al. | 428/339 |
| 2007/0090522 | A1 | 4/2007 | Alhayek et al. | 257/723 |
| 2007/0252166 | A1 | 11/2007 | Chang et al. | 257/98 |
| 2007/0267642 | A1 | 11/2007 | Erchak et al. | 257/98 |
| 2007/0290322 | A1 | 12/2007 | Zhao et al. | 257/690 |
| 2008/0019133 | A1 | 1/2008 | Kim et al. | 362/294 |
| 2008/0099770 | A1 | 5/2008 | Mendendorp et al. | 257/79 |
| 2008/0102631 | A1 | 5/2008 | Andryushchenko et al. | 438/686 |
| 2008/0173884 | A1 | 7/2008 | Chitnis et al. | 257/98 |
| 2008/0180824 | A1 | 7/2008 | Endoh et al. | 359/894 |
| 2009/0309213 | A1 | 12/2009 | Takahashi et al. | 257/707 |
| 2010/0149756 | A1 | 6/2010 | Rowcliffe et al. | 361/714 |
| 2010/0291737 | A1 | 11/2010 | Ikeguchi et al. | 438/108 |
| 2011/0133204 | A1 | 6/2011 | Lai | 257/76 |

* cited by examiner

SEMICONDUCTOR CHIP ASSEMBLY WITH BASE HEAT SPREADER AND CAVITY IN BASE

CROSS-REFERENCE TO RELATED APPLICATIONS

This application is a continuation-in-part of U.S. application Ser. No. 12/616,773 filed Nov. 11, 2009 now U.S. Pat. No. 8,067,784, which is incorporated by reference. This application is also a continuation-in-part of U.S. application Ser. No. 12/616,775 filed Nov. 11, 2009, which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009 now U.S. Pat. No. 7,948,076.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The heat spreader includes a base. A cavity extends through the adhesive into the base. The semiconductor device extends into the cavity, is electrically connected to the conductive trace and is thermally connected to the heat spreader. The adhesive extends between the cavity and the conductive trace and between the base and the conductive trace. The conductive trace is located outside the cavity and provides signal routing between a pad and a terminal.

In accordance with an aspect of the present invention, a semiconductor chip assembly includes a semiconductor device, an adhesive, a heat spreader, a conductive trace and an encapsulant. The heat spreader includes a base. The conductive trace includes a pad and a terminal. A cavity extends through the adhesive into the base, faces in the upward direction and has a diameter that increases as it extends downwardly through the adhesive to the base and decreases as it extends downwardly from the adhesive into the base.

The semiconductor device extends into the cavity, is electrically connected to the pad and thereby electrically connected to the terminal, and is thermally connected to the base. The adhesive is mounted on and extends above the base, extends between the cavity and the pad, extends laterally from the cavity to or beyond the terminal and is sandwiched between the base and the pad. The conductive trace is located outside the cavity. The encapsulant extends into the cavity and covers the semiconductor device in the upward direction. The base extends below the semiconductor device, the adhesive, the cavity, the encapsulant and the pad.

The conductive trace can include the pad, the terminal and a routing line, an electrically conductive path between the pad and the terminal can include the routing line and the pad, the terminal and the routing line can contact and overlap the adhesive.

In accordance with another aspect of the present invention, a semiconductor chip assembly includes a semiconductor device, an adhesive, a heat spreader, a substrate, a conductive trace and an encapsulant. The heat spreader includes a base. The substrate includes a dielectric layer, and an aperture extends through the substrate. The conductive trace includes a pad and a terminal. A cavity extends through the adhesive into the base, faces in the upward direction and has a diameter that increases as it extends downwardly through the adhesive to the base and decreases as it extends downwardly from the adhesive into the base.

The semiconductor device is located within the cavity, is electrically connected to the pad and thereby electrically connected to the terminal, and is thermally connected to the base. The adhesive is mounted on and extends above the base, extends into a gap in the aperture between the cavity and the substrate, extends across the dielectric layer in the gap, extends laterally from the cavity to or beyond the terminal and is sandwiched between the encapsulant and the dielectric layer and between the base and the dielectric layer. The substrate is mounted on the adhesive and extends above the base. The conductive trace is located outside the cavity. The encapsulant extends into the cavity and covers the semiconductor device in the upward direction. The base extends below the semiconductor device, the adhesive, the cavity, the encapsulant, the substrate and the pad.

The heat spreader can consist of copper, aluminum or copper/nickel/aluminum. The heat spreader can also provide heat dissipation and spreading from the semiconductor device to the next level assembly.

The semiconductor device can be mounted on and overlap the base but not the substrate or the conductive trace, be electrically connected to the pad using a wire bond that extends outside the cavity and be thermally connected to the base using a die attach that is located within the cavity. For instance, the semiconductor device can extend within and outside the cavity and the wire bond can be located outside the cavity. Alternatively, the semiconductor device can be located within the cavity and the wire bond can extend within and outside the cavity. In any case, the semiconductor device is located within a periphery of the cavity and the wire bond extends within and outside the periphery of the cavity.

The semiconductor device can be a packaged or unpackaged semiconductor chip. For instance, the semiconductor device can be an LED package that includes an LED chip. Alternatively, the semiconductor device can be a semiconductor chip such as an LED chip.

The adhesive can contact the encapsulant and the dielectric layer in the gap and contact the base, the encapsulant and the dielectric layer outside the gap. The adhesive can also cover the substrate in the downward direction, cover and surround the cavity above the base in the lateral directions and cover the base outside the cavity in the upward direction. The adhesive can also conformally coat a top surface of the base outside the cavity. The adhesive can also fill the aperture between the cavity and the dielectric layer, fill the space between the base and the substrate where the substrate overlaps the base and be a solidified prepreg.

The adhesive can extend laterally from the cavity to or beyond the terminal. For instance, the adhesive and the terminal can extend to peripheral edges of the assembly. In this instance, the adhesive extends laterally from the cavity to the terminal. Alternatively, the adhesive can extend to peripheral edges of the assembly and the terminal can be spaced from the peripheral edges of the assembly. In this instance, the adhesive extends laterally from the cavity beyond the terminal.

The adhesive can overlap or be overlapped by the terminal. For instance, the terminal can extend above and overlap the dielectric layer and the adhesive and be coplanar with the pad. In this instance, the adhesive is overlapped by the terminal and the assembly provides horizontal signal routing between the pad and the terminal. Alternatively, the terminal can extend below and be overlapped by the dielectric layer and the adhesive and be coplanar with the base. In this instance, the adhesive overlaps the terminal and the assembly provides vertical signal routing between the pad and the terminal.

The cavity can have a cut-off conical shape in the adhesive and a concave crater-like shape in the base. Furthermore, the cavity can have a diameter that abruptly increases to a maximum diameter at an interface between the adhesive and the base where the cavity extends laterally along a bottom surface of the adhesive to the base.

The base can cover the semiconductor device, the adhesive, the cavity, the encapsulant and the substrate in the downward direction, support the substrate and extend to peripheral edges of the assembly.

The encapsulant can be located within or extend within and outside the cavity, can be laterally confined by or extend laterally from the cavity, can contact the semiconductor device, the adhesive and the base in the cavity and can extend across and be spaced from the dielectric layer.

The substrate can be spaced from the cavity and the base. The substrate can also be a laminated structure. The substrate can also include a single conductive layer or multiple conductive layers. For instance, the substrate can include a single conductive layer that contacts and extends above the dielectric layer. In this instance, the conductive layer includes the pad and the terminal. Thus, the substrate includes the terminal, the adhesive is overlapped by the terminal and the signal routing between the pad and the terminal occurs above but not through the dielectric layer. Alternatively, the substrate can include a first conductive layer that contacts and extends above the dielectric layer, a second conductive layer that contacts and extends below the dielectric layer, and a via that extends through the dielectric layer and electrically connects the conductive layers. In this instance, the first conductive layer includes the pad. Furthermore, (1) the first conductive layer includes the terminal and the substrate includes another via that extends through the dielectric layer and electrically connects the conductive layers, in which case the substrate includes the terminal, the adhesive is overlapped by the terminal and the signal routing between the pad and the terminal occurs through the dielectric layer but not the adhesive, or alternatively, (2) the terminal is below the adhesive and the substrate and the assembly includes another via that extends through the adhesive and electrically connects the terminal and the second conductive layer, in which case the substrate excludes the terminal, the adhesive overlaps the terminal and the signal routing between the pad and the terminal occurs through the dielectric layer and the adhesive. In any case, the substrate includes the pad and provides some or all of the signal routing between the pad and the terminal.

The pad can be an electrical contact for the semiconductor device, the terminal can be an electrical contact for the next level assembly, and the pad and the terminal can provide signal routing between the semiconductor device and the next level assembly.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a post and a base, mounting an adhesive on the base including inserting the post into an opening in the adhesive, mounting a substrate on the adhesive including aligning the post with an aperture in the substrate, then flowing the adhesive into and upward in a gap located in the aperture between the post and the substrate, solidifying the adhesive, then etching the post and the base to form a cavity that extends through the adhesive into the base, then mounting a semiconductor device on the base, wherein a heat spreader includes the base and the semiconductor device extends into the cavity, electrically connecting the semiconductor device to the substrate and thermally connecting the semiconductor device to the heat spreader.

In accordance with an aspect of the present invention, a method of making a semiconductor chip assembly includes (1) providing a post, a base, an adhesive and a conductive layer, wherein (a) the post is adjacent to the base, extends above the base in an upward direction, extends into an opening in the adhesive and is aligned with an aperture in the conductive layer, (b) the base extends below the post in a downward direction opposite the upward direction and extends laterally from the post in lateral directions orthogonal to the upward and downward directions, (c) the adhesive is mounted on and extends above the base, is sandwiched between the base and the conductive layer and is non-solidified, and (d) the conductive layer is mounted on and extends above the adhesive, then (2) flowing the adhesive into and upward in a gap located in the aperture between the post and the conductive layer, (3) solidifying the adhesive, (4) providing a conductive trace that includes a pad, a terminal and a selected portion of the conductive layer, (5) etching the post and the base, thereby forming a cavity that extends through the adhesive into the base and faces in the upward direction, then (6) mounting a semiconductor device on the base, wherein a heat spreader includes the base and the semiconductor device extends into the cavity, (7) electrically connecting the semiconductor device to the pad, thereby electrically connecting the semiconductor device to the terminal, and (8) thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing an adhesive, wherein an opening extends through the adhesive, (3) providing a conductive layer, wherein an aperture extends through the conductive layer, (4) mounting the adhesive on the base, including inserting the post into the opening, wherein the adhesive extends above the base and the post extends into the opening, (5) mounting the conductive layer on the adhesive, including aligning the post with the aperture, wherein the conductive layer extends above the adhesive and the adhesive is sandwiched between the base and the conductive layer and is non-solidified, then (6) applying heat to melt the adhesive, (7) moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer, (8) applying heat to solidify the molten adhesive, thereby mechanically attaching the post and the base to the conductive layer, then (9) providing a conductive trace that includes a pad and a terminal, wherein the conductive trace includes selected portions of the conductive layer and an electrically conductive path is between the pad and the terminal, (10) etching the post and the base, thereby forming a cavity that extends through the adhesive into the base and faces in the upward direction, then (11) mounting a semiconductor device on the base, wherein a heat spreader includes the base and the semiconductor device extends into the cavity, (12) electrically connecting the semiconductor device to the pad, thereby electrically connecting the semiconductor device to the terminal, and (13) thermally connecting the semiconductor device to the base.

Mounting the conductive layer can include mounting the conductive layer alone on the adhesive, or alternatively, attaching the conductive layer to a carrier, then mounting the conductive layer and the carrier on the adhesive such that the carrier overlaps the conductive layer and the conductive layer contacts the adhesive and is sandwiched between the adhesive and the carrier, and then, after solidifying the adhesive, removing the carrier and then providing the conductive trace.

In accordance with another aspect of the present invention, a method of making a semiconductor chip assembly includes (1) providing a post, a base, an adhesive and a substrate, wherein (a) the substrate includes a conductive layer and a dielectric layer, (b) the post is adjacent to the base, extends above the base in an upward direction, extends through an opening in the adhesive and extends into an aperture in the substrate, (c) the base extends below the post in a downward direction opposite the upward direction and extends laterally from the post in lateral directions orthogonal to the upward and downward directions, (d) the adhesive is mounted on and extends above the base, is sandwiched between the base and the substrate and is non-solidified, (e) the substrate is mounted on and extends above the adhesive and the conductive layer extends above the dielectric layer, and (f) a gap is located in the aperture between the post and the substrate, then (2) flowing the adhesive into and upward in the gap, (3) solidifying the adhesive, then (4) etching the post and the base, thereby forming a cavity that extends through the adhesive into the base and faces in the upward direction, then (5) mounting a semiconductor device on the base, wherein a heat spreader includes the base, the semiconductor device extends into the cavity, a conductive trace includes a pad, a terminal and a selected portion of the conductive layer and the pad is electrically connected to the terminal, (6) electrically connecting the semiconductor device to the pad, thereby electrically connecting the semiconductor device to the terminal, and (7) thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing an adhesive, wherein an opening extends through the adhesive, (3) providing a substrate that includes a conductive layer and a dielectric layer, wherein an aperture extends through the substrate, (4) mounting the adhesive on the base, including inserting the post through the opening, wherein the adhesive extends above the base and the post extends through the opening, (5) mounting the substrate on the adhesive, including inserting the post into the aperture, wherein the substrate extends above the adhesive, the conductive layer extends above the dielectric layer, the post extends through the opening into the aperture, the adhesive is sandwiched between the base and the substrate and is non-solidified, and a gap is located in the aperture between the post and the substrate, then (6) applying heat to melt the adhesive, (7) moving the base and the substrate towards one another, thereby moving the post upward in the aperture and applying pressure to the molten adhesive between the base and the substrate, wherein the pressure forces the molten adhesive to flow into and upward in the gap and the post and the molten adhesive extend above the dielectric layer, (8) applying heat to solidify the molten adhesive, thereby mechanically attaching the post and the base to the substrate, then (9) etching the post and the base, thereby forming a cavity that extends through the adhesive into the base and faces in the upward direction, then (10) mounting a semiconductor device on the base, wherein a heat spreader includes the base, the semiconductor device is located within the cavity, a conductive trace includes a pad, a terminal and a selected portion of the conductive layer and the pad is electrically connected to the terminal, (11) electrically connecting the semiconductor device to the pad, thereby electrically connecting the semiconductor device to the terminal, and (12) thermally connecting the semiconductor device to the base.

Providing the post and the base can include providing a metal plate, forming an etch mask on the metal plate that selectively exposes the metal plate, etching the metal plate in a pattern defined by the etch mask, thereby forming a recess in the metal plate that extends into but not through the metal plate, and then removing the etch mask, wherein the post is an unetched portion of the metal plate that protrudes above the base and is laterally surrounded by the recess, and the base is an unetched portion of the metal plate below the post and the recess.

Providing the adhesive can include providing a prepreg with uncured epoxy, flowing the adhesive can include melting the uncured epoxy and compressing the uncured epoxy between the base and the substrate, and solidifying the adhesive can include curing the molten uncured epoxy.

Providing the pad can include removing selected portions of the conductive layer after solidifying the adhesive.

Providing the pad can also include grinding the post, the adhesive and the conductive layer after solidifying the adhesive such that the post, the adhesive and the conductive layer are laterally aligned with one another at a top lateral surface that faces in the upward direction, and then removing selected portions of the conductive layer such that the pad includes selected portions of the conductive layer. The grinding can include grinding the adhesive without grinding the post and then grinding the post, the adhesive and the conductive layer. The removing can include applying a wet chemical etch to the conductive layer using an etch mask that defines the pad.

Providing the pad can also include depositing a second conductive layer on the post, the adhesive and the conductive layer after the grinding and then removing selected portions of the conductive layers such that the pad includes selected portions of the conductive layers. Depositing the second conductive layer can include electrolessly plating a first plated layer on the post, the adhesive and the conductive layer and then electroplating a second plated layer on the first plated layer. The removing can include applying the wet chemical etch to the conductive layers using the etch mask to define the pad.

Providing the terminal can include removing selected portions of the conductive layer after solidifying the adhesive. Providing the terminal can also include the grinding and then removing selected portions of the conductive layer using the etch mask to define the terminal such that the terminal includes selected portions of the conductive layer. Providing the terminal can also include the grinding and then removing selected portions the conductive layers using the etch mask to define the terminal such that the terminal includes selected portions of the conductive layers. Thus, the pad and the terminal can be formed simultaneously using the same grinding, wet chemical etch and etch mask.

Forming the cavity can include etching the post and the base before, during or after removing the selected portions of the conductive layer. Forming the cavity can also include removing the post. Forming the cavity can also include removing selected portions of the second conductive layer. Forming the cavity can also include using the etch mask to define the pad and expose the post. Thus, the pad and the cavity can be formed simultaneously using the same wet chemical etch and etch mask or sequentially using different wet chemical etches and etch masks.

Flowing the adhesive can include filling the gap with the adhesive. Flowing the adhesive can also include squeezing the adhesive through the gap, above the post and the substrate and on top surface portions of the post and the substrate adjacent to the gap.

Solidifying the adhesive can include mechanically bonding the post and the base to the substrate.

Mounting the semiconductor device can include providing a die attach between a semiconductor chip and the base, electrically connecting the semiconductor device can include providing a wire bond between the chip and the pad, and thermally connecting the semiconductor device can include providing the die attach between the chip and the base.

The adhesive can contact the base and the dielectric layer, cover the substrate in the downward direction, cover and surround the cavity above the base in the lateral directions and extend to peripheral edges of the assembly after the assembly is manufactured and detached from other assemblies in a batch.

The base can cover the semiconductor device, the adhesive, the cavity and the substrate in the downward direction, support the substrate and extend to peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The base can be a single-piece metal, thereby enhancing reliability. The cavity can focus the light generated by an LED chip mounted on the base within into the cavity, thereby enhancing the light output. The adhesive can be sandwiched between the base and the substrate, thereby providing a robust mechanical bond between the heat spreader and the substrate. The substrate can provide single-layer signal routing with simple circuitry patterns or flexible multi-layer signal routing with complex circuitry patterns. The conductive trace can provide horizontal signal routing between the pad and the terminal above the dielectric layer or vertical signal routing between the pad above the dielectric layer and the terminal below the adhesive. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
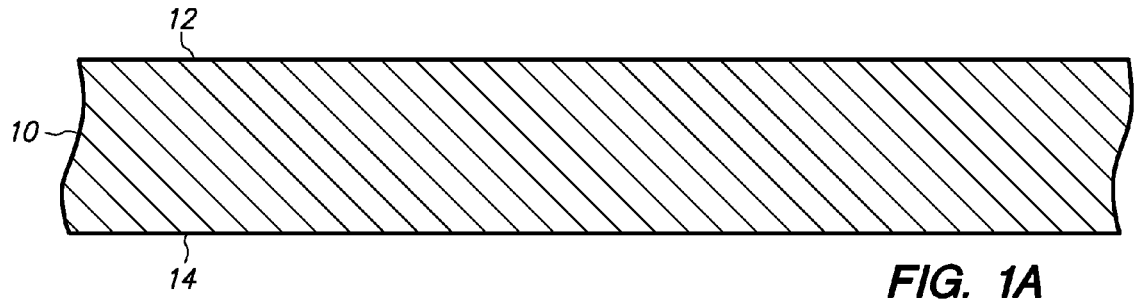
FIGS. 1A-1D are cross-sectional views showing a method of making a post and a base in accordance with an embodiment of the present invention.
Figure 1B:
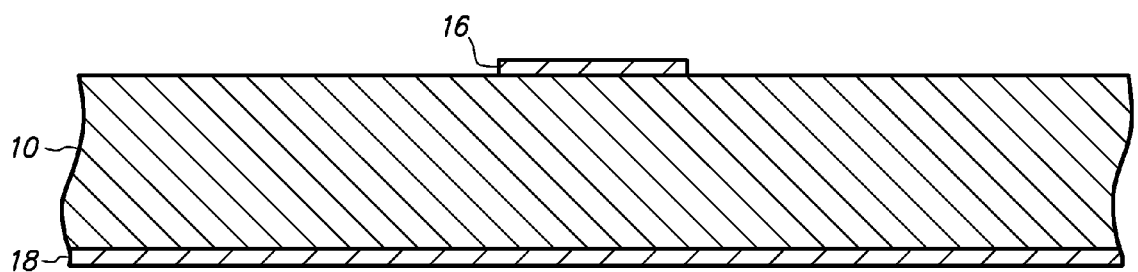
Figure 1C:
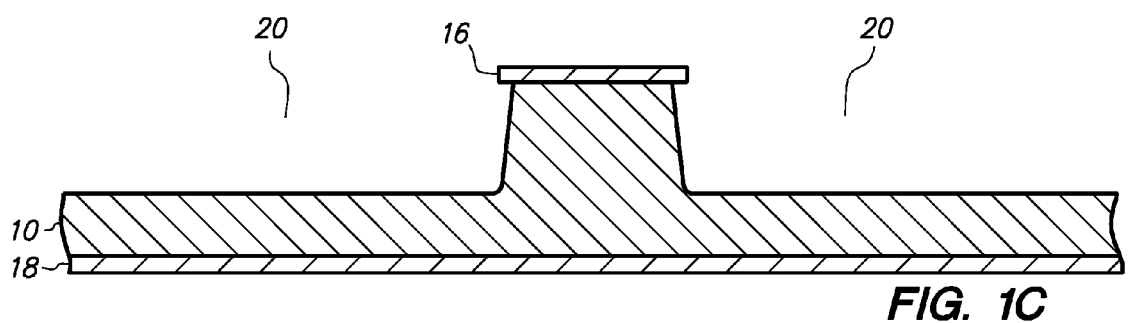
Figure 1D:
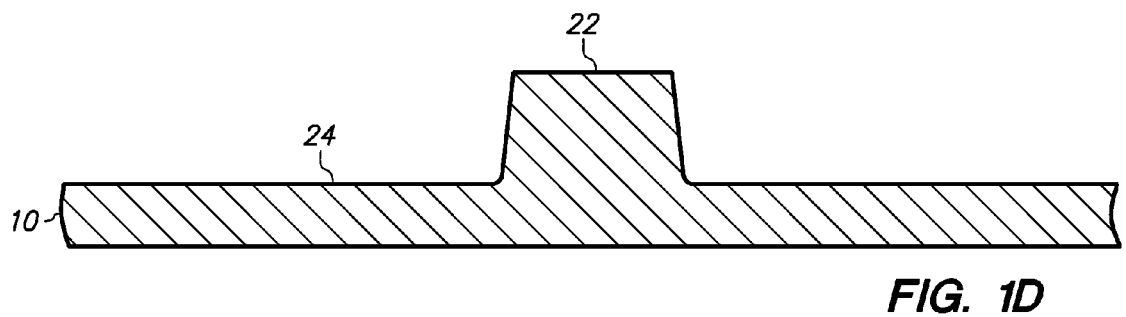
Figure 1E:
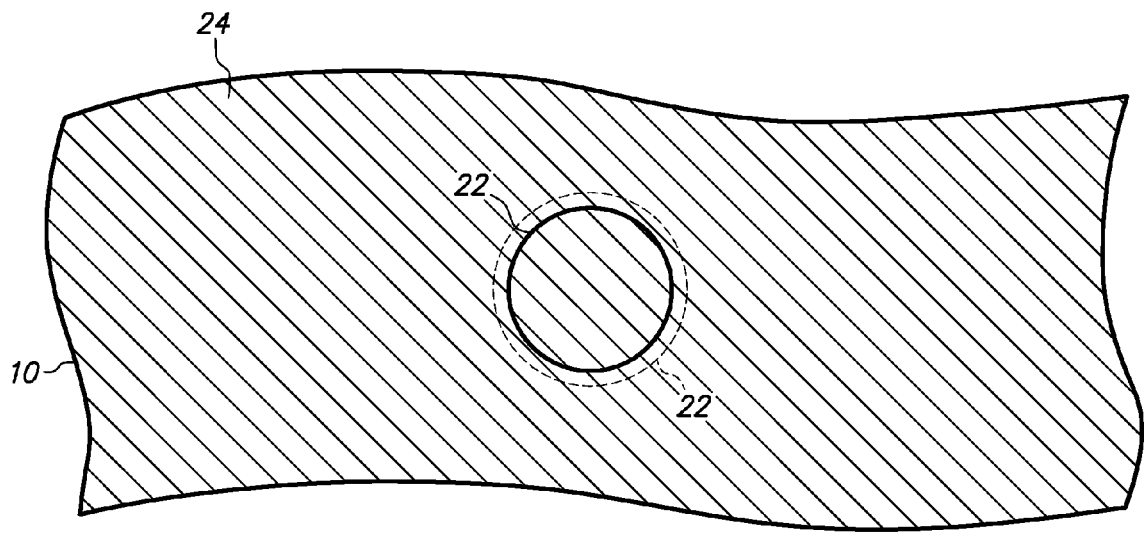
FIGS. 1E and 1F are top and bottom views, respectively, corresponding to FIG. 1D.
Figure 1F:
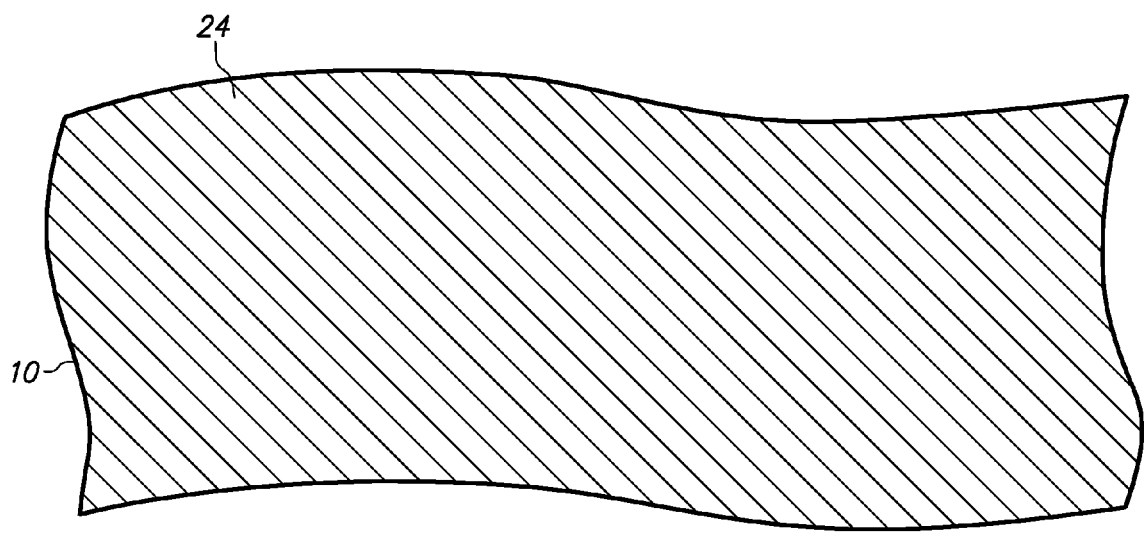

FIGS. 1A-1D are cross-sectional views showing a method of making a post and a base in accordance with an embodiment of the present invention, and FIGS. 1E and 1F are top and bottom views, respectively, corresponding to FIG. 1D.

FIG. 1A. is a cross-sectional view of metal plate 10 which includes opposing major surfaces 12 and 14. Metal plate 10 is illustrated as a copper plate with a thickness of 500 microns. Copper has high thermal conductivity, good bondability and low cost. Metal plate 10 can be various metals such as copper, aluminum, alloy 42, iron, nickel, silver, gold, combinations thereof, and alloys thereof.

FIG. 1B is a cross-sectional view of etch mask 16 and cover mask 18 formed on metal plate 10. Etch mask 16 and cover mask 18 are illustrated as photoresist layers which are deposited on metal plate 10 using dry film lamination in which hot rolls simultaneously press photoresist layers 16 and 18 onto surfaces 12 and 14, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12, and photoresist layer 18 remains unpatterned and covers surface 14.

FIG. 1C is a cross-sectional view of recess 20 formed into but not through metal plate 10 by etching metal plate 10 in the pattern defined by etch mask 16. The etching is illustrated as a front-side wet chemical etch. For instance, the structure can be inverted so that etch mask 16 faces downward and cover mask 18 faces upward as a bottom spray nozzle (not shown) that faces etch mask 16 upwardly sprays the wet chemical etch on metal plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides back-side protection. The wet chemical etch is highly selective of copper and etches 300 microns into metal plate 10. As a result, recess 20 extends from surface 12 into but not through metal plate 10, is spaced from surface 14 by 200 microns and has a depth of 300 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing metal plate 10 to the wet chemical etch can be established through trial and error.

FIGS. 1D, 1E and 1F are cross-sectional, top and bottom views, respectively, of metal plate 10 after etch mask 16 and cover mask 18 are removed. The photoresist layers are stripped using a solvent, such as a strong alkaline solution containing potassium hydroxide with a pH of 14, that is highly selective of photoresist with respect to copper.

Metal plate 10 as etched includes post 22 and base 24.

Post 22 is an unetched portion of metal plate 10 defined by etch mask 16. Post 22 is adjacent to and integral with and protrudes above base 24 and is laterally surrounded by recess 20. Post 22 has a height of 300 microns (recess 20 depth), a diameter at its top surface (circular portion of surface 12) of 1500 microns and a diameter at its bottom (circular portion adjacent to base 24) of 1600 microns. Thus, post 22 has a cut-off conical shape (resembling a frustum) with tapered sidewalls in which its diameter decreases as it extends upwardly from base 24 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Base 24 is an unetched portion of metal plate 10 that is below post 22, extends laterally from post 22 in a lateral plane (with lateral directions such as left and right) and has a thickness of 200 microns (500−300).

Post 22 and base 24 can be treated to improve bondability to epoxy and solder. For instance, post 22 and base 24 can be chemically oxidized or microetched to provide rougher surfaces.

Post 22 and base 24 are illustrated as a subtractively formed single-piece metal (copper). Post 22 and base 24 can also be a stamped single-piece metal formed by stamping metal plate 10 with a contact piece with a recess or hole that defines post 22. Post 22 can also be formed additively by depositing post 22 on base 24 using electroplating, chemical vapor deposition (CVD), physical vapor deposition (PVD) and so on, for instance by electroplating a solder post 22 on a copper base 24, in which case post 22 and base 24 have a metallurgical interface and are adjacent to but not integral with one another. Post 22 can also be formed semi-additively, for instance by depositing an upper portion of post 22 on an etch-defined lower portion of post 22. Post 22 and base 24 can also be formed semi-additively by depositing a conformal upper portion of post 22 and base 24 on an etch-defined lower portion of post 22 and base 24. Post 22 can also be sintered to base 24.

Figure 2A:
FIGS. 2A and 2B are cross-sectional views showing a method of making an adhesive in accordance with an embodiment of the present invention.
Figure 2B:
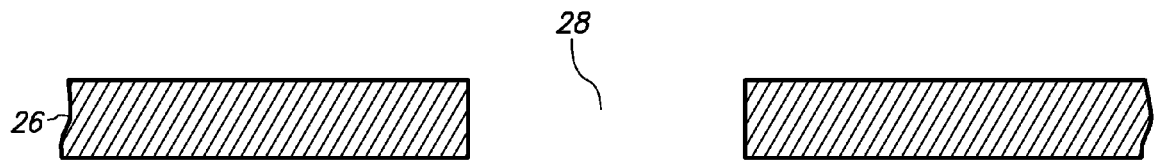
Figure 2C:
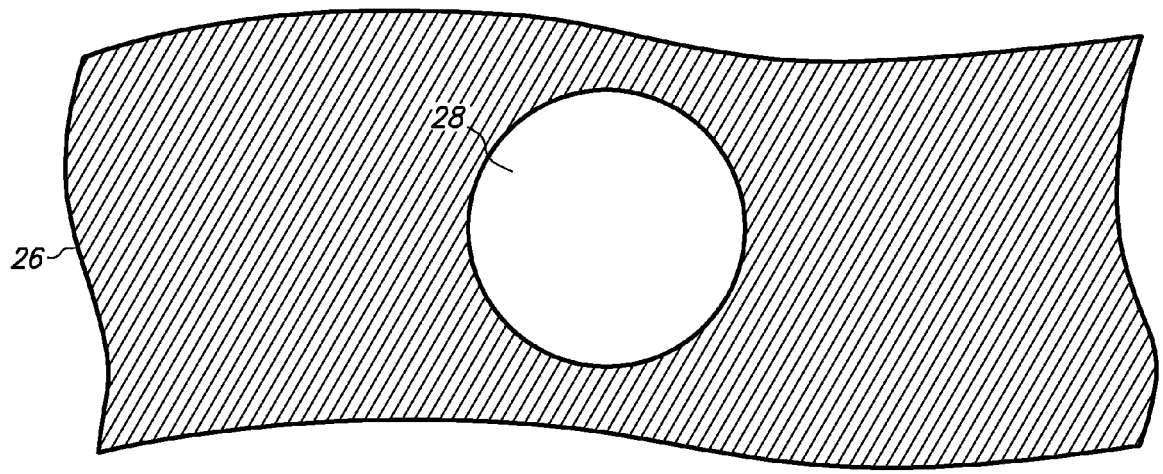
FIGS. 2C and 2D are top and bottom views, respectively, corresponding to FIG. 2B.
Figure 2D:
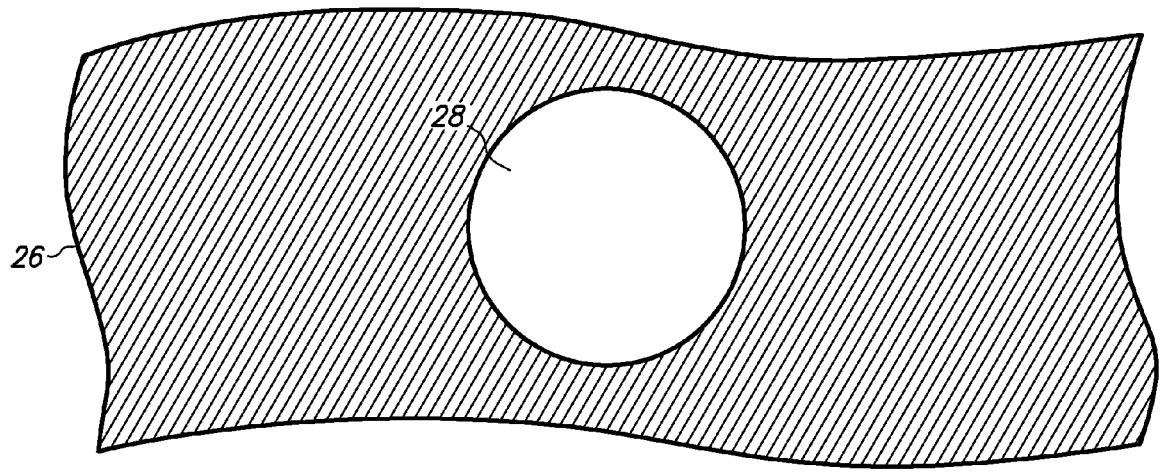

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 26. Adhesive 26 is illustrated as a prepreg with B-stage uncured epoxy provided as a non-solidified unpatterned sheet with a thickness of 180 microns.

Adhesive 26 can be various dielectric films or prepregs formed from numerous organic or inorganic electrical insulators. For instance, adhesive 26 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 26 with opening 28. Opening 28 is a central window that extends through adhesive 26. Opening 28 is formed by mechanical drilling through the prepreg and has a diameter of 1650 microns. Opening 28 can be formed by other techniques such as punching and stamping.

Figure 3A:
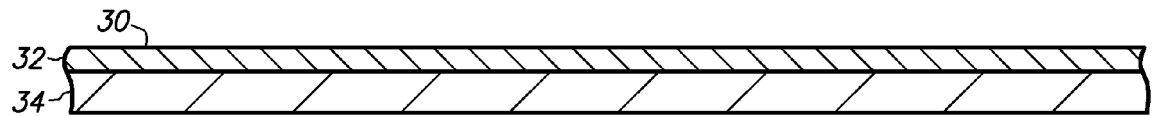
FIGS. 3A and 3B are cross-sectional views showing a method of making a substrate in accordance with an embodiment of the present invention.
Figure 3B:
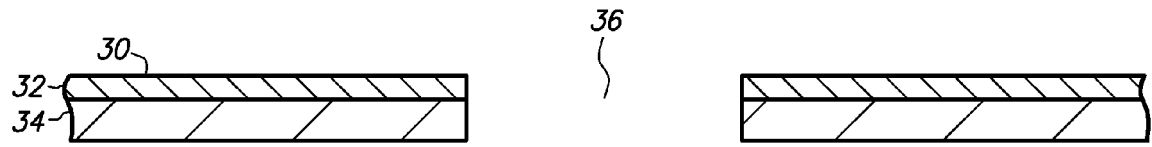
Figure 3C:
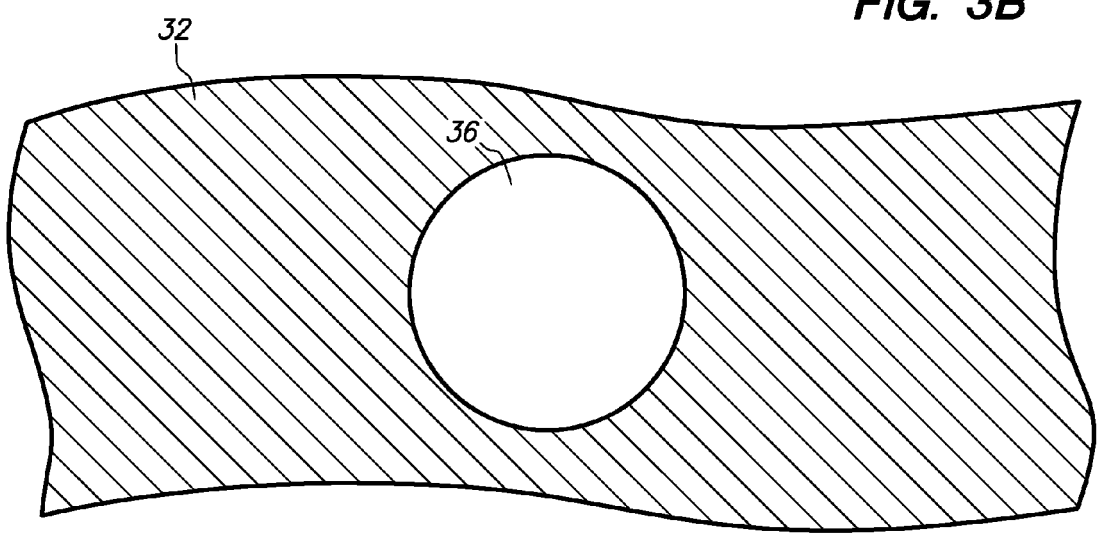
FIGS. 3C and 3D are top and bottom views, respectively, corresponding to FIG. 3B.
Figure 3D:
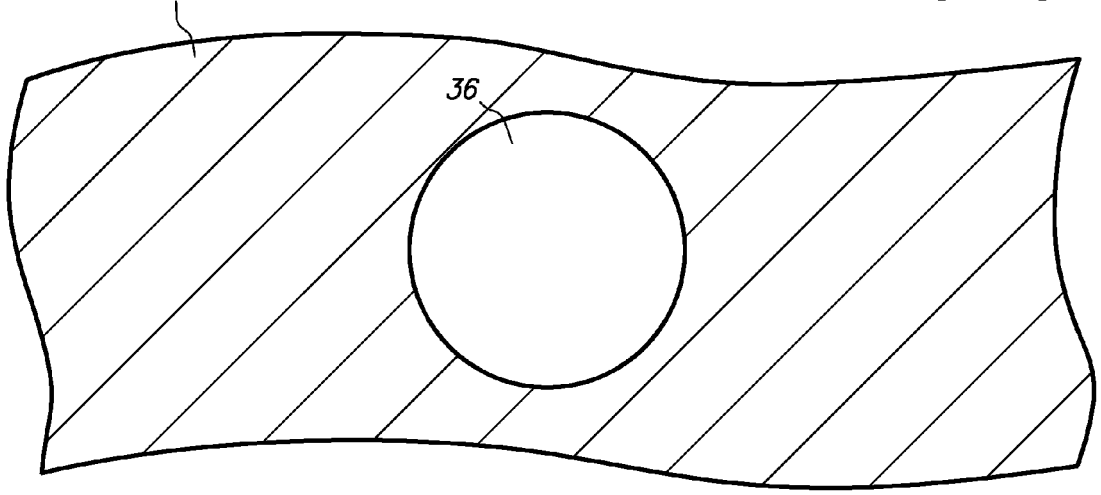

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 30 that includes conductive layer 32 and dielectric layer 34. Conductive layer 32 is an electrical conductor that contacts and extends above dielectric layer 34, and dielectric layer 34 is an electrical insulator. For instance, conductive layer 32 is an unpatterned copper sheet with a thickness of 45 microns, and dielectric layer 34 is epoxy with a thickness of 135 microns.

FIGS. 3B, 3C and 3D are cross-sectional, top and bottom views, respectively, of substrate 30 with aperture 36. Aperture 36 is a central window that extends through substrate 30. Aperture 36 is formed by mechanical drilling through conductive layer 32 and dielectric layer 34 and has a diameter of 1650 microns. Aperture 36 can be formed with other techniques such as punching and stamping. Preferably, opening 28 and aperture 36 have the same diameter and are formed in the same manner with the same drill bit at the same drilling station.

Substrate 30 is illustrated as a laminated structure. Substrate 30 can be other electrical interconnects such as a ceramic board or a printed circuit board. Likewise, substrate 30 can include additional layers of embedded circuitry.

Figure 4A:
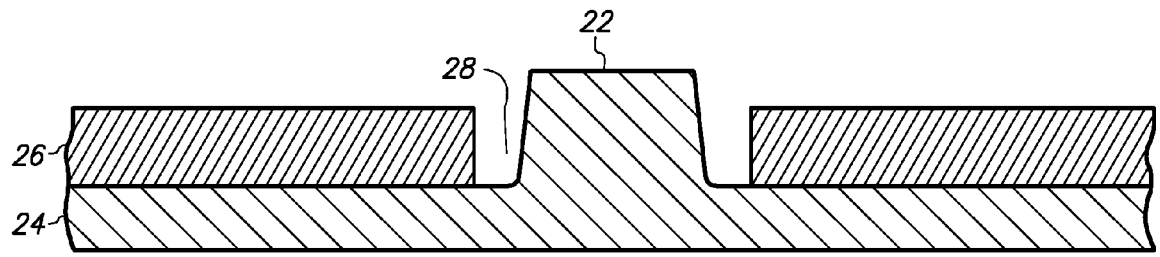
FIGS. 4A-4N are cross-sectional views showing a method of making a thermal board with horizontal signal routing in accordance with an embodiment of the present invention.
Figure 4B:
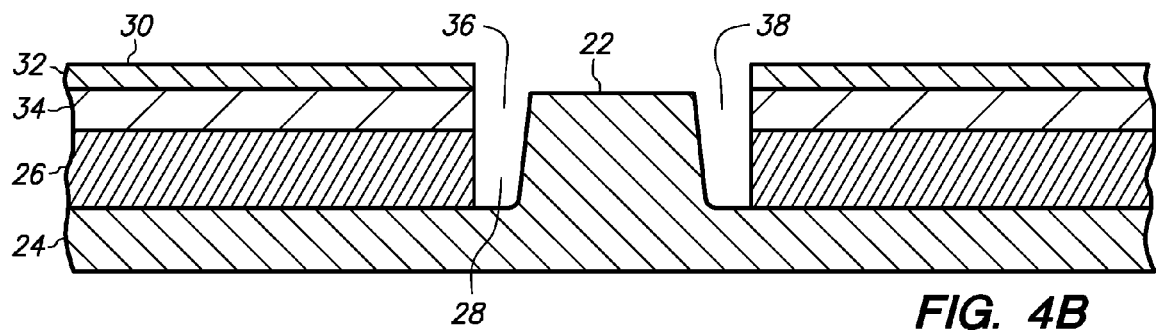
FIGS. 4O and 4P are top and bottom views, respectively, corresponding to FIG. 4N.
Figure 4C:
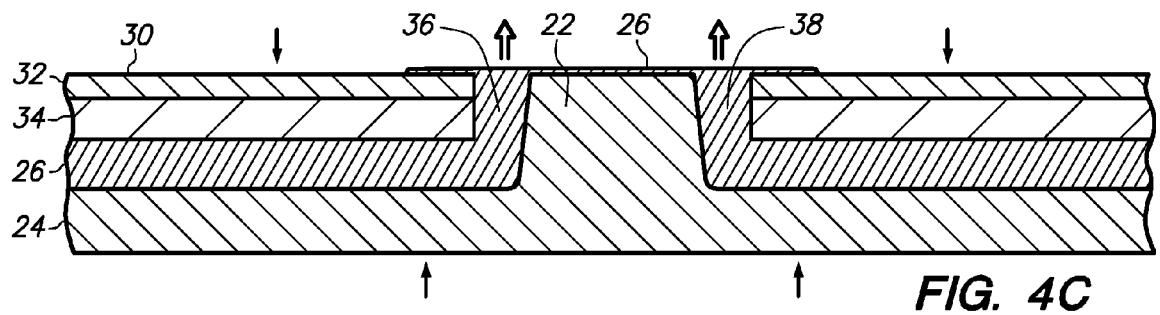
Figure 4D:
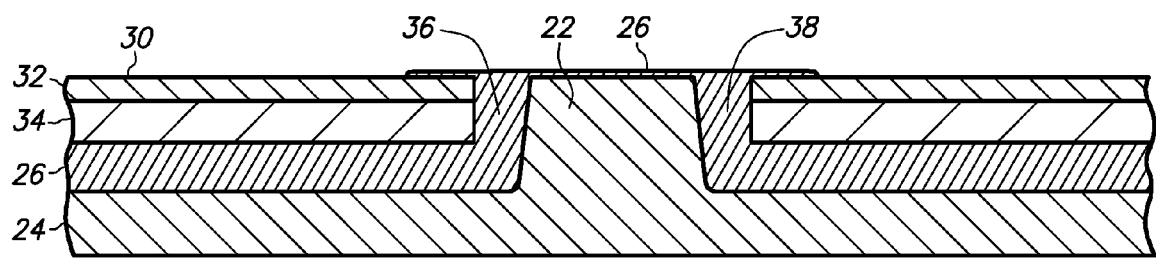
Figure 4E:
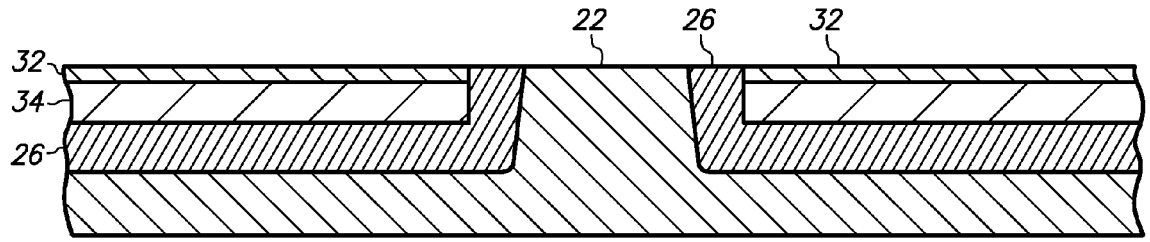
Figure 4F:
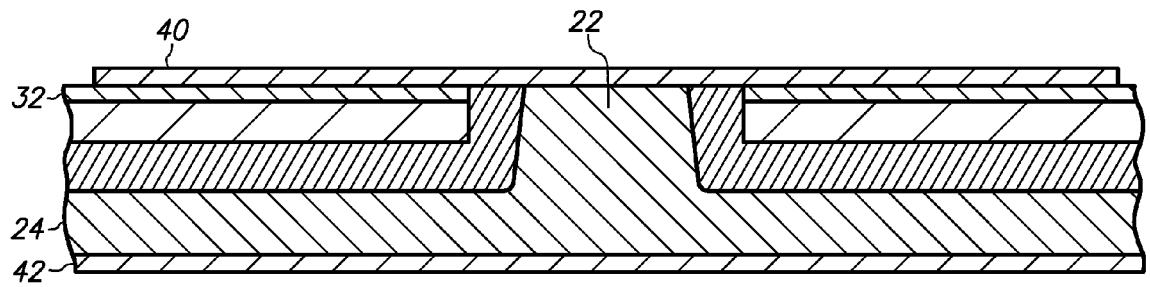
Figure 4G:
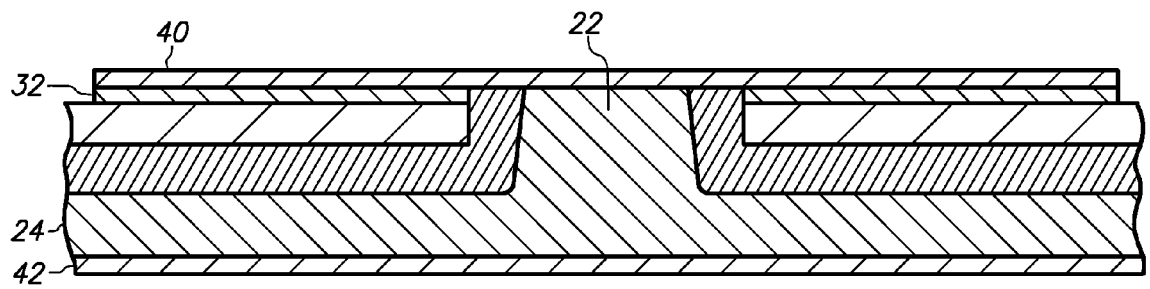
Figure 4H:
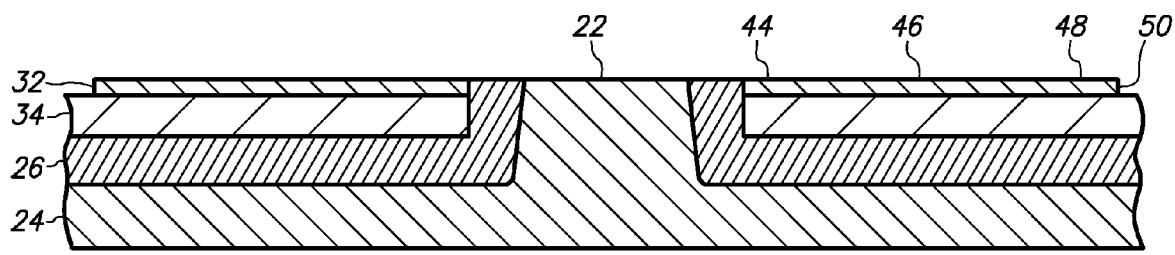
Figure 4I:
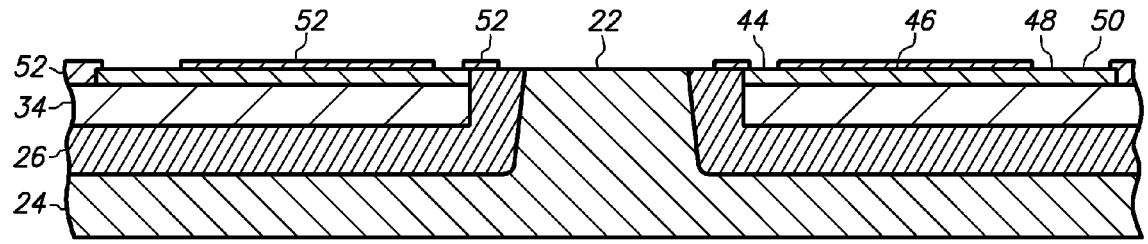
Figure 4J:
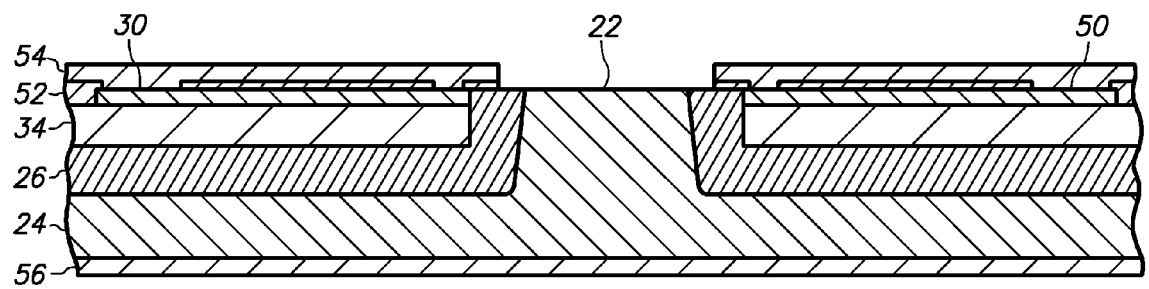
Figure 4K:
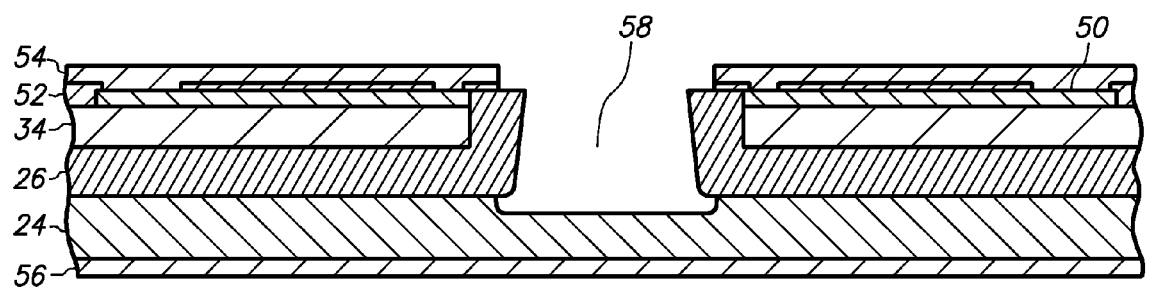
Figure 4L:
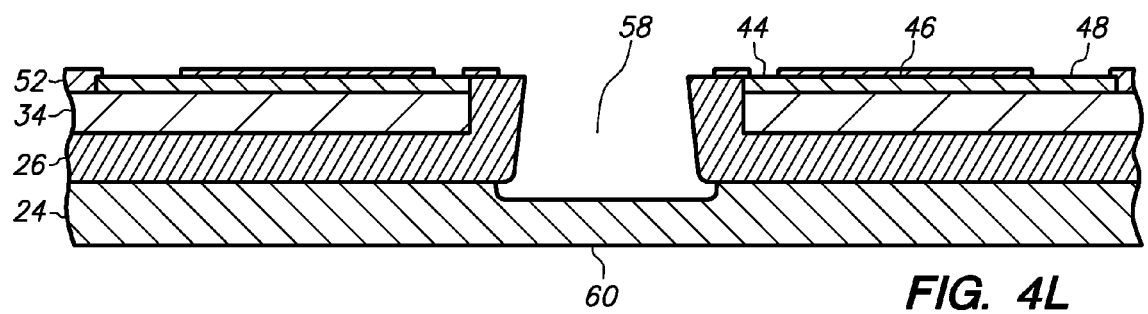
Figure 4M:
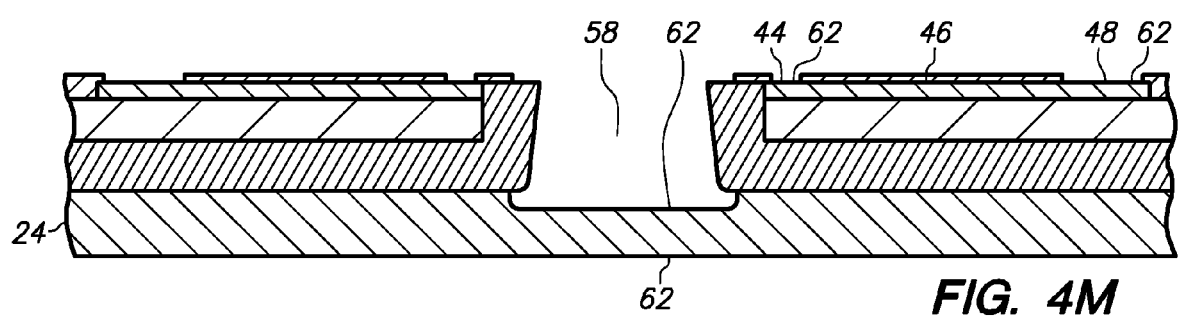
Figure 4N:
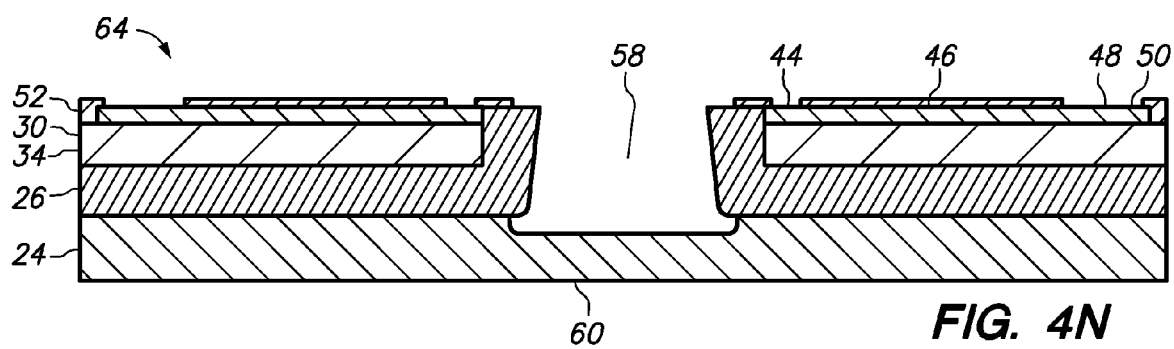
Figure 4O:
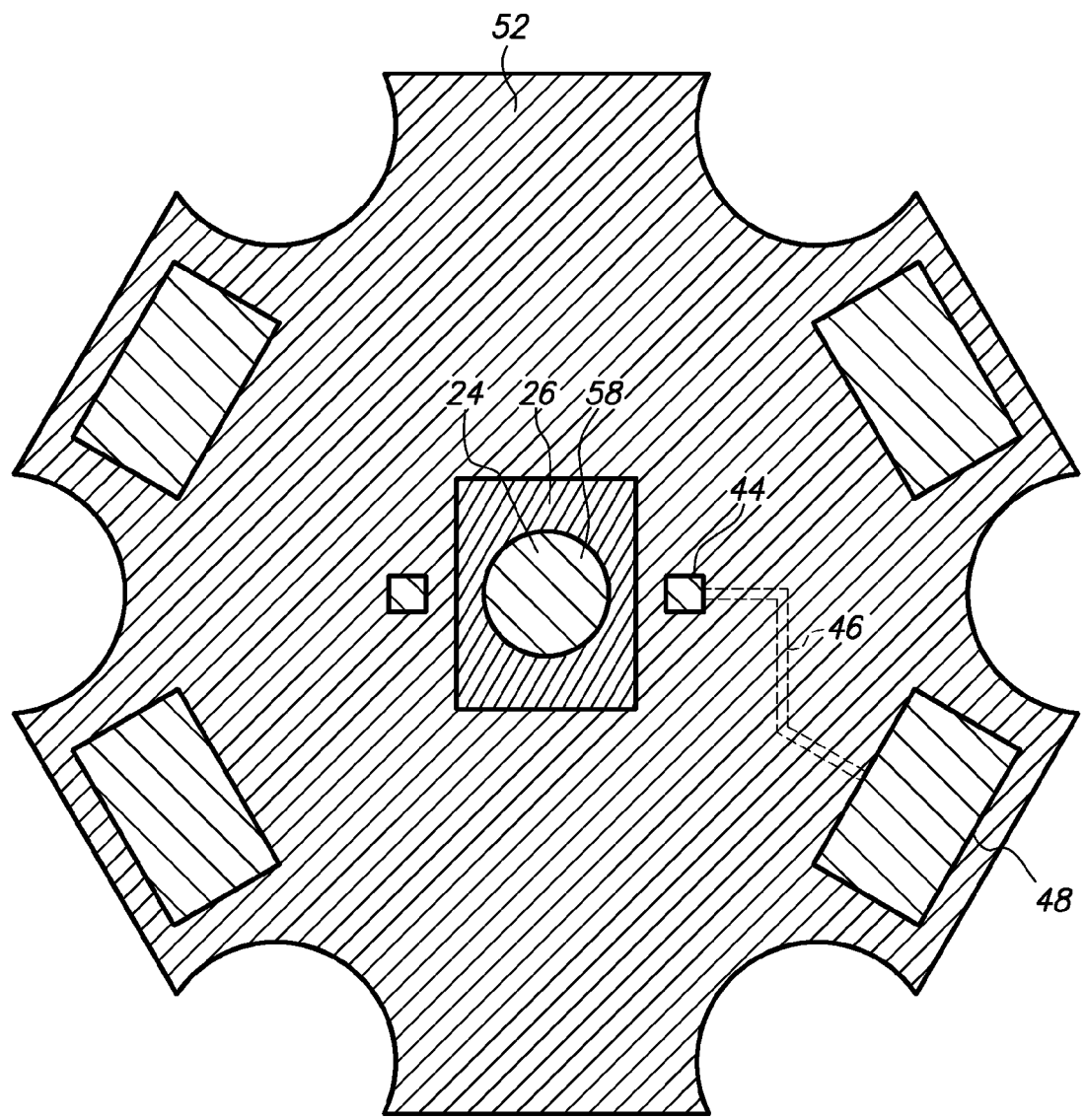
Figure 4P:
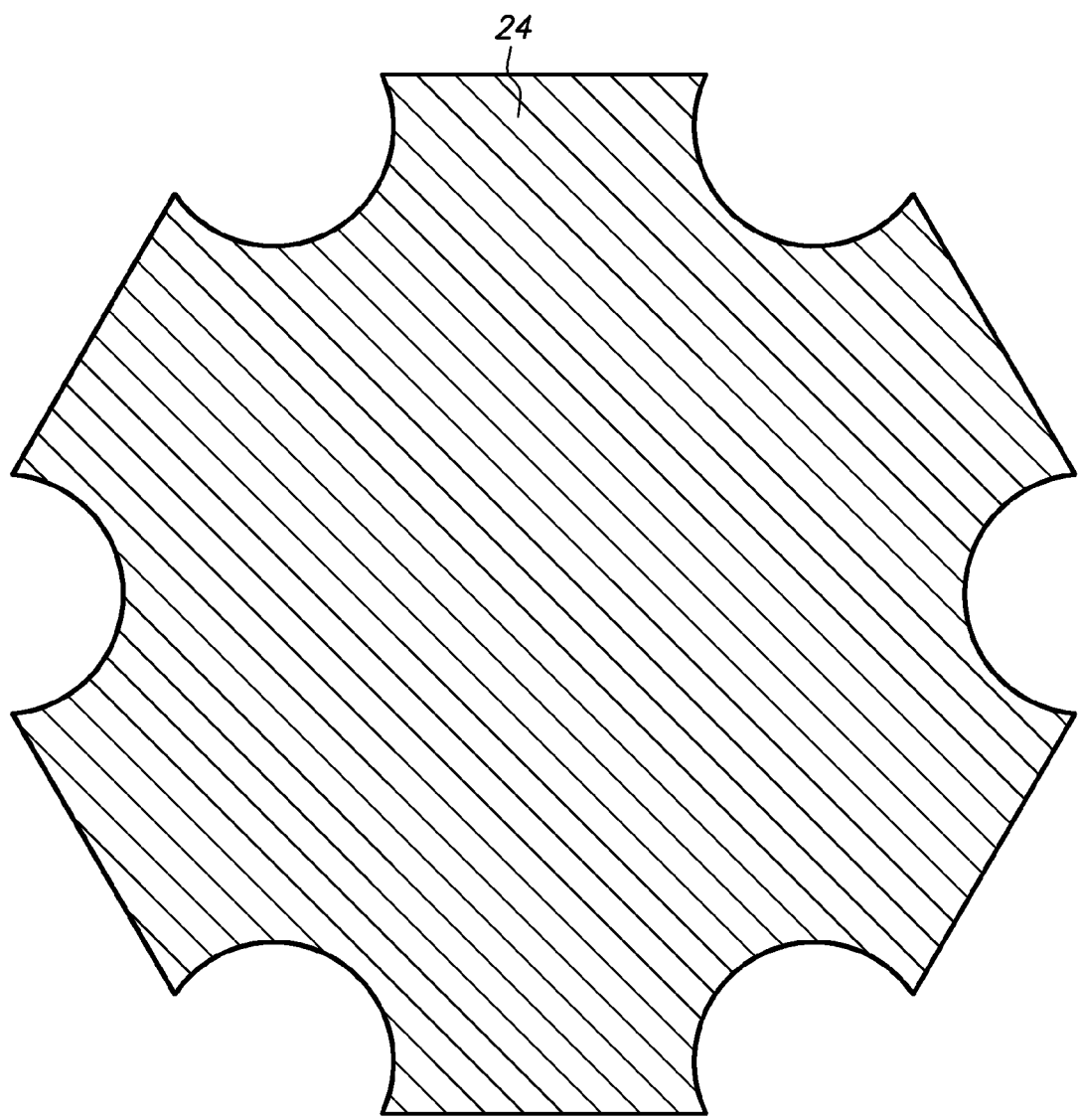

FIGS. 4A-4N are cross-sectional views showing a method of making a thermal board with horizontal signal routing that includes base 24, adhesive 26 and substrate 30 in accordance with an embodiment of the present invention, and FIGS. 4O and 4P are top and bottom views, respectively, corresponding to FIG. 4N.

FIG. 4A is a cross-sectional view of the structure with adhesive 26 mounted on base 24. Adhesive 26 is mounted by lowering it onto base 24 as post 22 is inserted into and through and upwards in opening 28. Adhesive 26 eventually contacts and rests on base 24. Preferably, post 22 is inserted into and extends through opening 28 without contacting adhesive 26 and is aligned with and centrally located within opening 28.

FIG. 4B is a cross-sectional view of the structure with substrate 30 mounted on adhesive 26. Substrate 30 is mounted by lowering it onto adhesive 26 as post 22 is inserted into and upwards in aperture 36. Substrate 30 eventually contacts and rests on adhesive 26. Preferably, post 22 is inserted into but not through aperture 36 without contacting substrate 30 and is aligned with and centrally located within aperture 36. As a result, gap 38 is located in aperture 36 between post 22 and substrate 30. Gap 38 laterally surrounds post 22 and is laterally surrounded by substrate 30. In addition, opening 28 and aperture 36 are precisely aligned with one another and have the same diameter.

At this stage, substrate 30 is mounted on and contacts and extends above adhesive 26. Post 22 extends through opening 28 into aperture 36 to dielectric layer 34, is 60 microns below the top surface of conductive layer 32 and is exposed through aperture 36 in the upward direction. Adhesive 26 contacts and is sandwiched between base 24 and substrate 30, contacts dielectric layer 34 but is spaced from conductive layer 32 and remains a non-solidified prepreg with B-stage uncured epoxy, and gap 38 is filled with air.

FIG. 4C is a cross-sectional view of the structure with adhesive 26 in gap 38. Adhesive 26 is flowed into gap 38 by applying heat and pressure. In this illustration, adhesive 26 is forced into gap 38 by applying downward pressure to conductive layer 32 and/or upward pressure to base 24, thereby moving base 24 and substrate 30 towards one another and applying pressure to adhesive 26 while simultaneously applying heat to adhesive 26. Adhesive 26 becomes compliant enough under the heat and pressure to conform to virtually any shape. As a result, adhesive 26 sandwiched between base 24 and substrate 30 is compressed, forced out of its original shape and flows into and upward in gap 38. Base 24 and substrate 30 continue to move towards one another and adhesive 26 eventually fills gap 38. Moreover, adhesive 26 remains sandwiched between and continues to fill the reduced space between base 24 and substrate 30.

For instance, base 24 and conductive layer 32 can be disposed between top and bottom platens (not shown) of a press. In addition, a top cull plate and top buffer paper (not shown) can be sandwiched between conductive layer 32 and the top platen, and a bottom cull plate and bottom buffer paper (not shown) can be sandwiched between base 24 and the bottom platen. The stack includes the top platen, top cull plate, top buffer paper, substrate 30, adhesive 26, base 24, bottom buffer paper, bottom cull plate and bottom platen in descending order. Furthermore, the stack may be positioned on the bottom platen by tooling pins (not shown) that extend upward from the bottom platen through registration holes (not shown) in base 24.

The platens are heated and move towards one another, thereby applying heat and pressure to adhesive 26. The cull plates disperse the heat from the platens so that it is more uniformly applied to base 24 and substrate 30 and thus adhesive 26, and the buffer papers disperse the pressure from the platens so that it is more uniformly applied to base 24 and substrate 30 and thus adhesive 26. Initially, dielectric layer 34 contacts and presses down on adhesive 26. As the platen motion and heat continue, adhesive 26 between base 24 and substrate 30 is compressed, melted and flows into and upward in gap 38 and across dielectric layer 34 to conductive layer 32. For instance, the uncured epoxy is melted by the heat and the molten uncured epoxy is squeezed by the pressure into gap 38, however the reinforcement and the filler remain between base 24 and substrate 30. Adhesive 26 elevates more rapidly than post 22 in aperture 36 and fills gap 38. Adhesive 26 also rises slightly above gap 38 and overflows onto the top surfaces of post 22 and conductive layer 32 adjacent to gap 38 before the platen motion stops. This may occur due to the prepreg being slightly thicker than necessary. As a result, adhesive 26 creates a thin coating on the top surface of post 22. The platen motion is eventually blocked by post 22 and the platens become stationary but continue to apply heat to adhesive 26.

The upward flow of adhesive 26 in gap 38 is shown by the thick upward arrows, the upward motion of post 22 and base 24 relative to substrate 30 is shown by the thin upward arrows, and the downward motion of substrate 30 relative to post 22 and base 24 is shown by the thin downward arrows.

FIG. 4D is a cross-sectional view of the structure with adhesive 26 solidified.

For instance, the platens continue to clamp post 22 and base 24 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 26 as solidified provides a secure robust mechanical bond between post 22 and substrate 30 as well as between base 24 and substrate 30. Adhesive 26 can withstand normal operating pressure without distortion or damage and is only temporarily distorted under unusually high pressure. Furthermore, adhesive 26 can absorb thermal expansion mismatch between post 22 and substrate 30 and between base 24 and substrate 30.

At this stage, post 22 and conductive layer 32 are essentially coplanar with one another and adhesive 26 and conductive layer 32 extend to a top surface that faces in the upward direction. For instance, adhesive 26 between base 24 and dielectric layer 34 has a thickness of 120 microns which is 60 microns less than its initial thickness of 180 microns, post 22 ascends 60 microns in aperture 36 and substrate 30 descends 60 microns relative to post 22. The 300 micron height of post 22 is essentially the same as the combined height of conductive layer 32 (45 microns), dielectric layer 34 (135 microns) and the underlying adhesive 26 (120 microns). Furthermore, post 22 continues to be centrally located in opening 28 and aperture 36 and spaced from substrate 30, and adhesive 26 fills the space between base 24 and substrate 30 and fills gap 38. For instance, gap 38 (as well as adhesive 26 between post 22 and substrate 30) has a width of 75 microns ((1650−1500)/2) at the top surface of post 22. Adhesive 26 extends across dielectric layer 34 in gap 38. That is, adhesive 26 in gap 38 extends in the upward and downward directions across the thickness of dielectric layer 34 at the outer sidewall of gap 38. Adhesive 26 also includes a thin top portion above gap 38 that contacts the top surfaces of post 22 and conductive layer 32 and extends above post 22 by 10 microns.

FIG. 4E is a cross-sectional view of the structure after upper portions of post 22, adhesive 26 and conductive layer 32 are removed.

Post 22, adhesive 26 and conductive layer 32 have their upper portions removed by grinding. For instance, a rotating diamond sand wheel and distilled water are applied to the top of the structure. Initially, the diamond sand wheel grinds only adhesive 26. As the grinding continues, adhesive 26 becomes thinner as its grinded surface migrates downwardly. Eventually the diamond sand wheel contacts post 22 and conductive layer 32 (not necessarily at the same time), and as a result, begins to grind post 22 and conductive layer 32 as well. As the grinding continues, post 22, adhesive 26 and conductive layer 32 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 26, a 15 micron thick upper portion of post 22 and a 15 micron thick upper portion of conductive layer 32. The decreased thickness does not appreciably affect post 22 or adhesive 26. However, it substantially reduces the thickness of conductive layer 32 from 45 microns to 30 microns.

At this stage, post 22, adhesive 26 and conductive layer 32 are coplanar with one another at a smoothed lapped lateral top surface that is above dielectric layer 34 and faces in the upward direction.

FIG. 4F is a cross-sectional view of the structure with etch mask 40 and cover mask 42 formed on the top and bottom surfaces, respectively, of the structure. Etch mask 40 and cover mask 42 are illustrated as photoresist layers similar to photoresist layers 16 and 18, respectively. Photoresist layer 40 has a pattern that selectively exposes conductive layer 32 and covers post 22, and photoresist layer 42 remains unpatterned and covers base 24.

FIG. 4G is a cross-sectional view of the structure with selected portions of conductive layer 32 removed by etching conductive layer 32 in the pattern defined by etch mask 40. The etching is a front-side wet chemical etch similar to the etch applied to metal plate 10. The wet chemical etch etches through conductive layer 32 to expose adhesive 26 and dielectric layer 34 and converts conductive layer 32 from an unpatterned into a patterned layer, post 22 is not affected and base 24 remains unpatterned.

FIG. 4H is a cross-sectional view of the structure after etch mask 40 and cover mask 42 are removed. Photoresist layers 40 and 42 can be stripped in the same manner as photoresist layers 16 and 18.

Conductive layer 32 as etched includes pad 44, routing line 46 and terminal 48. Pad 44, routing line 46 and terminal 48 are unetched portions of conductive layer 32 defined by etch mask 40. Thus, conductive layer 32 is a patterned layer that includes pad 44, routing line 46 and terminal 48 and excludes post 22 and base 24. Furthermore, routing line 46 is a copper trace that contacts and extends above dielectric layer 34 and is adjacent to and electrically connects pad 44 and terminal 48.

Conductive trace 50 is provided by pad 44, routing line 46 and terminal 48. Similarly, an electrically conductive path between pad 44 and terminal 48 is routing line 46. Conductive trace 50 provides horizontal (lateral) fan-out routing from pad 44 to terminal 48. Conductive trace 50 is not be limited to this configuration. For instance, the electrically conductive path can include vias that extend through dielectric layer 34 and additional routing lines (above and/or below dielectric layer 34) as well as passive components such as resistors and capacitors mounted on additional pads.

FIG. 4I is a cross-sectional view of the structure with solder mask 52 formed on adhesive 26, dielectric layer 34 and conductive trace 50.

Solder mask 52 is an electrically insulative layer that is selectively patterned to expose post 22, pad 44 and terminal 48 and cover routing line 46 and the exposed portions of dielectric layer 34 in the upward direction. Solder mask 52 has a thickness of 25 microns above pad 44 and terminal 48 and extends 55 microns (30+25) above dielectric layer 34.

Solder mask 52 can initially be a photoimageable liquid resin that is dispensed on the structure. Thereafter, solder mask 52 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

FIG. 4J is a cross-sectional view of the structure with etch mask 54 and cover mask 56 formed on the top and bottom surfaces, respectively, of the structure. Etch mask 54 and cover mask 56 are illustrated as photoresist layers similar to photoresist layers 16 and 18, respectively. Photoresist layer 54 has a pattern that exposes post 22 and covers substrate 30, conductive trace 50 and solder mask 52, and photoresist layer 56 remains unpatterned and covers base 24.

FIG. 4K is a cross-sectional view of the structure with post 22 removed and a crater formed in base 24 by etching post 22 as fully exposed by etch mask 54 and then base 24 as selectively exposed by adhesive 26. The etching is a front-side wet chemical etch similar to the etch applied to metal plate 10. The wet chemical etch removes post 22 and etches into but not through base 24 to create cavity 58 in base 24 and adhesive 26, and conductive trace 50 is not affected and remains patterned.

The wet chemical etch etches 25 microns into base 24. Therefore, it reduces the thickness of base 24 beneath cavity 58 from 300 microns to 275 microns (300–25) but does not affect base 24 outside cavity 58.

FIG. 4L is a cross-sectional view of the structure after etch mask 54 and cover mask 56 are removed. Photoresist layers 54 and 56 can be stripped in the same manner as photoresist layers 16 and 18.

Cavity 58 extends through adhesive 26 into base 24, is spaced from substrate 30 and conductive trace 50 and faces in the upward direction. In other words, cavity 58 exposes base 24 in the upward direction and is covered by base 24 in the downward direction but not the upward direction. Cavity 58 is also covered and surrounded by base 24 (below adhesive 26) and adhesive 26 (above base 24) in the lateral directions. Thus, cavity 58 is defined by base 24 and adhesive 26.

Cavity 58 has a depth of 25 microns in base 24 and 285 microns (300–15) in adhesive 26 and thus is 310 microns deep. Cavity 58 has a diameter that increases as it extends downwardly from its circular entrance (at the top surface of adhesive 26) through adhesive 26 to base 24 and decreases as it extends downwardly from adhesive 26 into base 24 to its bottom within base 24. Thus, cavity 58 has a cut-off conical shape (resembling a frustum) in adhesive 26 with tapered sidewalls that slant outwardly as it extends downwardly and a concave crater-like shape in base 24 with tapered sidewalls that slant inwardly as it extends downwardly. The tapered sidewalls in adhesive 26 arise from the lateral undercutting by the wet chemical etch beneath etch mask 16 as post 22 is formed, and the tapered sidewalls in base 24 arise from the lateral undercutting by the wet chemical etch beneath adhesive 26 as cavity 58 is formed. Cavity 58 also has its entrance and its bottom concentrically disposed within its maximum diameter at the interface between base 24 and adhesive 26. Cavity 58 thus has an inverted mushroom-like shape that includes a stem (in adhesive 26) and a dome (in base 24).

Heat spreader 60 is provided by base 24 and is essentially a heat slug with rectangular cuboid-like shape.

FIG. 4M is a cross-sectional view of the structure with plated contacts 62 formed on base 24, pad 44 and terminal 48.

Plated contacts 62 are thin spot plated metal coatings that contact base 24 (in cavity 58), pad 44 and terminal 48 and cover their exposed portions in the upward direction and contact base 24 (at bottom surface 14) and cover it in the downward direction. For instance, a nickel layer is electrolessly plated on base 24, pad 44 and terminal 48, and then a silver layer is electrolessly plated on the nickel layer. The buried nickel layer has a thickness of 3 microns, the silver surface layer has a thickness of 0.5 microns, and plated contacts 62 have a thickness of 3.5 microns.

Base 24, pad 44 and terminal 48 treated with plated contacts 62 as a surface finish have several advantages. The buried nickel layer provides the primary mechanical and electrical and/or thermal connection, and the silver surface layer provides a wettable surface to facilitate solder reflow, a metallurgical surface for a wire bond and a reflective surface for an LED chip subsequently mounted on base 24 in cavity 58. Plated contacts 62 also protect base 24, pad 44 and terminal 48 from corrosion. Plated contacts 62 can include a wide variety of metals to accommodate the external connection media. For instance, a gold surface layer plated on a buried nickel layer can accommodate a solder joint or a wire bond.

Base 24, pad 44 and terminal 48 treated with plated contacts 62 are shown as single layers for convenience of illustration. The boundary (not shown) with plated contacts 62 in base 24, pad 44 and terminal 48 occurs at the copper/nickel interface.

At this stage, the manufacture of thermal board 64 can be considered complete.

FIGS. 4N, 4O and 4P are cross-sectional, top and bottom views, respectively, of thermal board 64 after it is detached at peripheral edges along cut lines from a support frame and/or adjacent thermal boards in a batch.

Thermal board 64 includes adhesive 26, substrate 30, solder mask 52 and heat spreader 60. Substrate 30 includes dielectric layer 34 and conductive trace 50 which includes pad 44, routing line 46 and terminal 48. Heat spreader 60 includes base 24.

Base 24 covers adhesive 26, substrate 30, conductive trace 50, solder mask 52 and cavity 58 in the downward direction and extends to the peripheral edges of thermal board 64. Cavity 58 remains exposed by adhesive 26.

Adhesive 26 is mounted on and extends above base 24, contacts dielectric layer 34 and fills the space between dielectric layer 34 and cavity 58 in gap 38, contacts and is sandwiched between and fills the space between base 24 and dielectric layer 34 outside gap 38, extends laterally from cavity 58 beyond and is overlapped by terminal 48, covers base 24 outside the periphery of cavity 58 in the upward direction, covers substrate 30 in the downward direction, fills the space between substrate 30 and heat spreader 60 and is solidified.

Substrate 30 is mounted on and contacts adhesive 26, extends above the underlying adhesive 26 and extends above base 24, dielectric layer 34 contacts and is sandwiched between adhesive 26 and conductive trace 50, and conductive trace 50 (as well as pad 44, routing line 46 and terminal 48) contacts and extends above dielectric layer 34.

Base 24 remains spaced from substrate 30. As a result, substrate 30 and heat spreader 60 are mechanically attached and electrically isolated from one another.

Base 24, adhesive 26, dielectric layer 34 and solder mask 52 extend to straight vertical peripheral edges of thermal board 64 after it is detached or singulated from a batch of identical simultaneously manufactured thermal boards.

Pad 44 is customized as an electrical interface for a semiconductor device such as an LED chip that is subsequently mounted on base 24 in cavity 58, terminal 48 is customized as an electrical interface for the next level assembly such as a solderable wire from a printed circuit board, and base 24 is customized as a thermal interface for the next level assembly such as a heat sink for an electronic device.

Pad 44 and terminal 48 are laterally offset from one another and exposed at the top surface of thermal board 64, thereby providing horizontal fan-out routing between the semiconductor device and the next level assembly. Pad 44 and terminal 48 are also coplanar with one another at their top surfaces above dielectric layer 34.

Conductive trace 50 is shown in cross-section as a continuous circuit trace for convenience of illustration. However, conductive trace 50 typically provides horizontal signal routing in both the X and Y directions. That is, pad 44 and terminal 48 are laterally offset from one another in the X and Y directions, and routing line 46 routes in the X and Y directions.

Heat spreader 60 provides heat spreading and heat dissipation from a semiconductor device that is subsequently mounted on base 24 in cavity 58 to the next level assembly that thermal board 64 is subsequently mounted on. The semiconductor device generates heat that flows into base 24 where it is spread out and dissipated in the downward direction, for instance to an underlying heat sink.

Thermal board 64 does not expose routing line 46. Routing line 46 is covered by solder mask 52 and is shown in phantom in FIG. 4O for convenience of illustration.

Thermal board 64 includes multiple conductive traces 50 that typically include pad 44, routing line 46 and terminal 48. A single conductive trace 50 is described and labeled for convenience of illustration. In conductive traces 50, pads 44 and terminals 48 generally have identical shapes and sizes whereas routing lines 46 may (but need not) have different routing configurations. For instance, some conductive traces 50 may be spaced and separated and electrically isolated from one another whereas other conductive traces 50 can intersect or route to the same pad 44, routing line 46 or terminal 48 and be electrically connected to one another. Likewise, some pads 44 may receive independent signals whereas other pads 44 share a common signal, power or ground.

Thermal board 64 can be adapted for an LED package with blue, green and red LED chips, with each LED chip including an anode and a cathode and each LED package including a corresponding anode terminal and cathode terminal. In this instance, thermal board 64 can include six pads 44 and four terminals 48 so that each anode is routed from a separate pad 44 to a separate terminal 48 whereas each cathode is routed from a separate pad 44 to a common ground terminal 48.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 50 after they are formed. A plating bus can be disconnected during the wet chemical etch that forms pad 44, routing line 46 and terminal 48.

Thermal board 64 can include registration holes (not shown) that are drilled or sliced through base 24, adhesive 26, substrate 30 and solder mask 52 so that thermal board 64 can be positioned by inserting tooling pins through the registration holes when it is subsequently mounted on an underlying carrier.

Thermal board 64 can accommodate multiple semiconductor devices rather than one. This can be accomplished by adjusting etch mask 16 to define additional posts 22, adjusting adhesive 26 to include additional openings 28, adjusting substrate 30 to include additional apertures 36, adjusting etch mask 40 to define additional pads 44, routing lines 46 and terminals 48, adjusting solder mask 52 to contain additional openings and adjusting etch mask 54 to expose additional posts 22. The elements except for terminals 48 can be laterally repositioned to provide a 2×2 array for four semiconductor devices. In addition, the topography (lateral shape) can be adjusted for some but not all of the elements. For instance, pads 44 and terminals 48 can retain the same topography whereas routing lines 46 have different routing configurations.

Figure 5A:
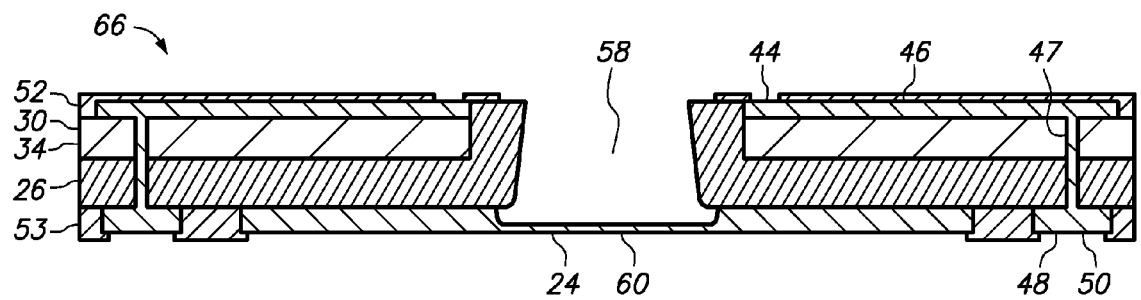
FIGS. 5A, 5B and 5C are cross-sectional, top and bottom views, respectively, of a thermal board with vertical signal routing in accordance with an embodiment of the present invention.
Figure 5B:
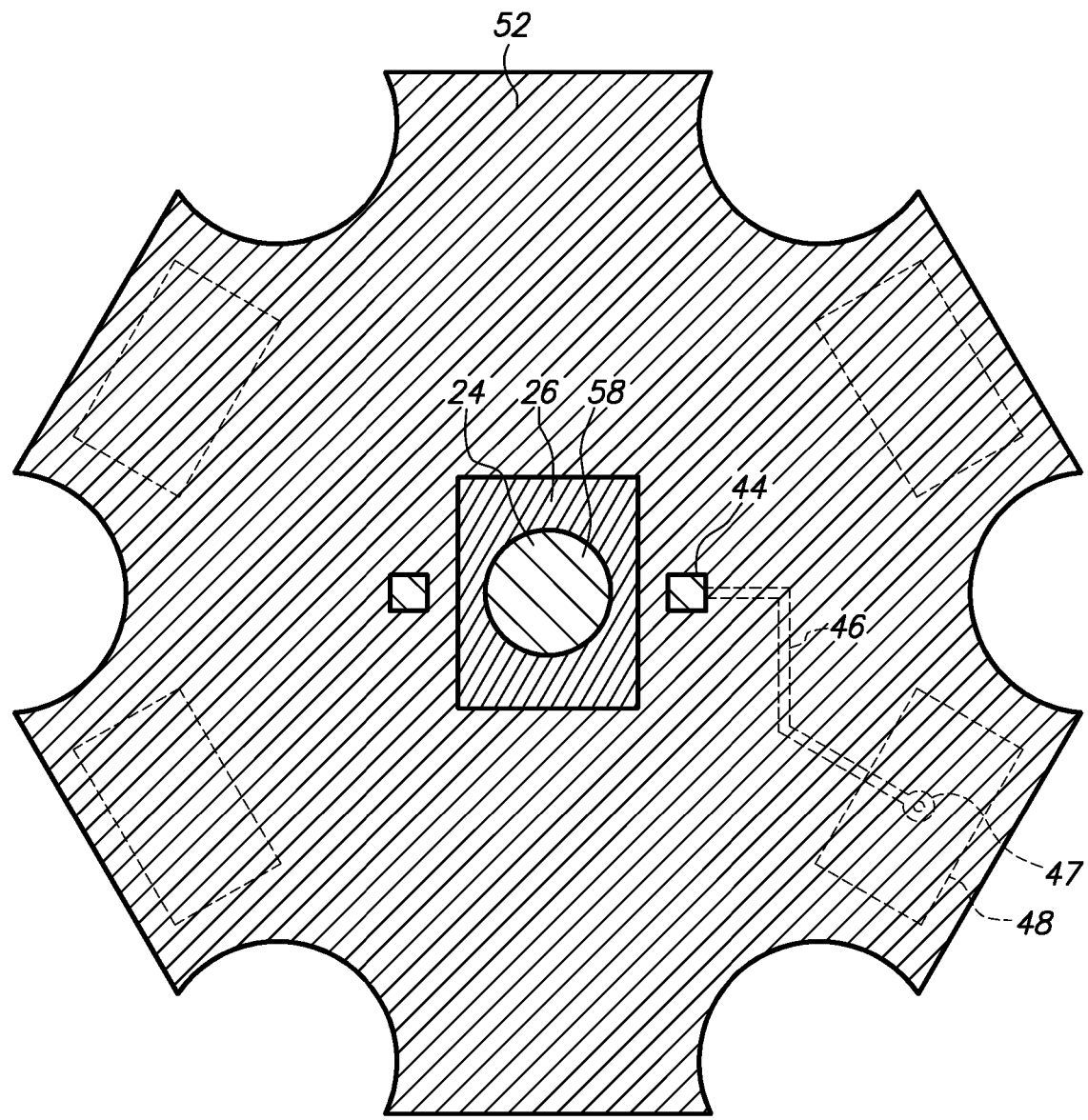
Figure 5C:
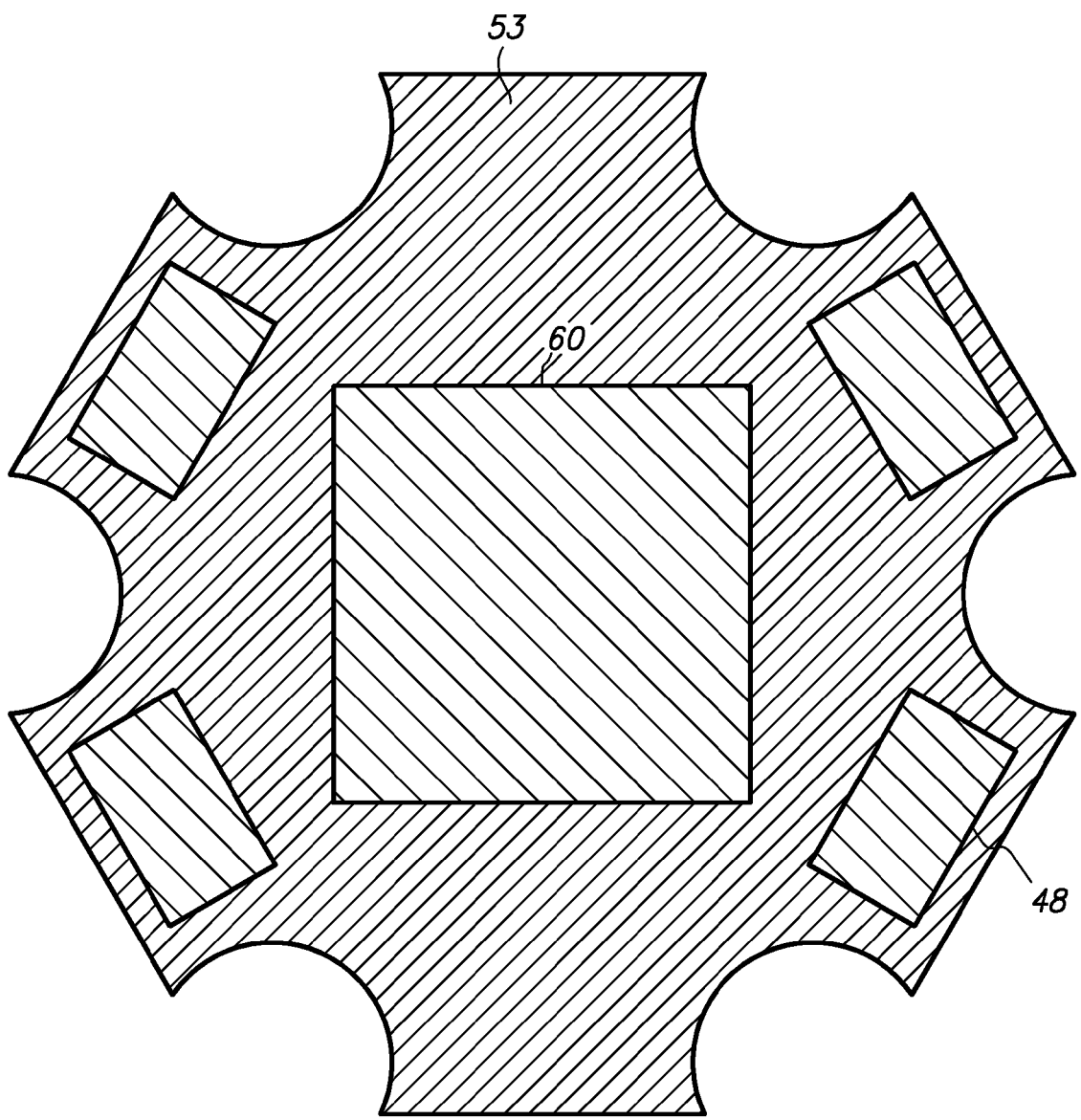

FIGS. 5A, 5B and 5C are cross-sectional, top and bottom views, respectively, of a thermal board with vertical signal routing in accordance with an embodiment of the present invention.

In this embodiment, the terminal is located at the bottom of the thermal board. For purposes of brevity, any description of thermal board 64 is incorporated herein insofar as the same is applicable, and the same description need not be repeated. Likewise, elements of the thermal board similar to those in thermal board 64 have corresponding reference numerals.

Thermal board 66 includes adhesive 26, substrate 30, conductive trace 50, solder masks 52 and 53 and heat spreader 60. Substrate 30 includes dielectric layer 34. Conductive trace 50 includes pad 44, routing line 46, via 47 and terminal 48. Heat spreader 60 includes base 24.

Base 24 is thinner in this embodiment than the previous embodiment and is spaced from the peripheral edges of thermal board 66 and covers cavity 58 but not adhesive 26, substrate 30, conductive trace 50 or solder masks 52 and 53 in the downward direction. Base 24 also supports substrate 30 and is coplanar with terminal 48 below adhesive 26.

Via 47 is an electrical conductor that extends vertically from routing line 46 through dielectric layer 34 and adhesive 26 to terminal 48. Furthermore, terminal 48 contacts and extends below adhesive 26, is spaced from and extends below substrate 30 and is spaced from and located between base 24 and the peripheral edges of thermal board 66. Thus, adhesive 26 extends laterally from cavity 58 beyond and overlaps terminal 48, via 47 is adjacent to and electrically connects routing line 46 and terminal 48, and conductive trace 50 provides vertical (top to bottom) signal routing from pad 44 to terminal 48.

Solder mask 53 is an electrically insulative layer similar to solder mask 52 that exposes base 24 and terminal 48 and covers the exposed portions of adhesive 26 in the downward direction.

Thermal board 66 can be manufactured in a manner similar to thermal board 64 with suitable adjustments for base 24, conductive trace 50 and solder masks 52 and 53. For instance, metal plate 10 has a thickness of 350 microns (rather than 500 microns) so that base 24 has a thickness of 50 microns (rather than 200 microns). Thereafter, adhesive 26 is mounted on base 24, substrate 30 is mounted on adhesive 26, heat and pressure are applied to flow and solidify adhesive 26 and then grinding is applied to planarize the top surface as previously described. Next, a hole is drilled downward through conductive layer 32, dielectric layer 34 and adhesive 26 into but not through base 24 and then via 47 is deposited into the hole by electroplating, screen printing or dispensing by an injection nozzle in step-and-repeat fashion. Thereafter, conductive layer 32 is etched to form pad 44 and routing line 46 and base 24 is etched to form terminal 48. Base 24 as etched is reduced to its central portion and terminal 48 is an unetched portion of base 24 that contacts and extends below adhesive 26, is spaced and separated from and no longer a part of base 24 and is adjacent to via 47. Thereafter, solder mask 52 is formed on the top surface to expose post 22 and pad 44, solder mask 53 is formed on the bottom surface to selectively expose base 24 and terminal 48, then post 22 and base 24 are etched to form cavity 58 and then plated contacts 62 provide a surface finish for base 24, pad 44 and terminal 48.

Figure 6A:
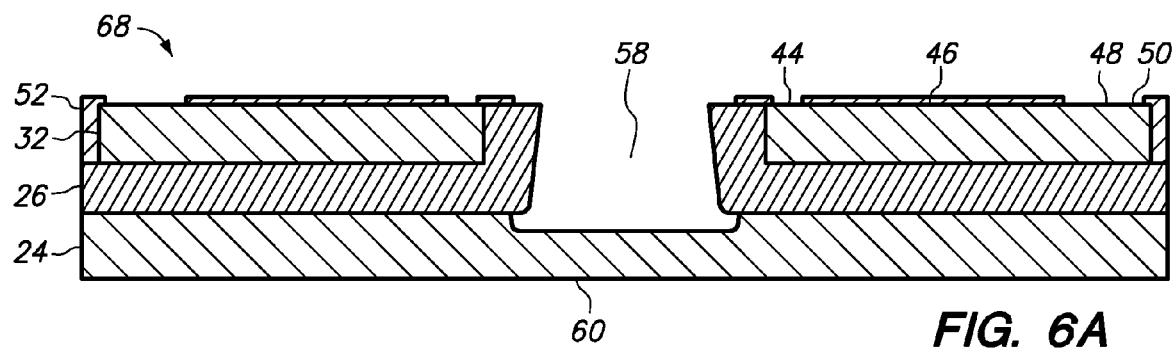
FIGS. 6A, 6B and 6C are cross-sectional, top and bottom views, respectively, of a thermal board with a conductive trace on an adhesive in accordance with an embodiment of the present invention.
Figure 6B:
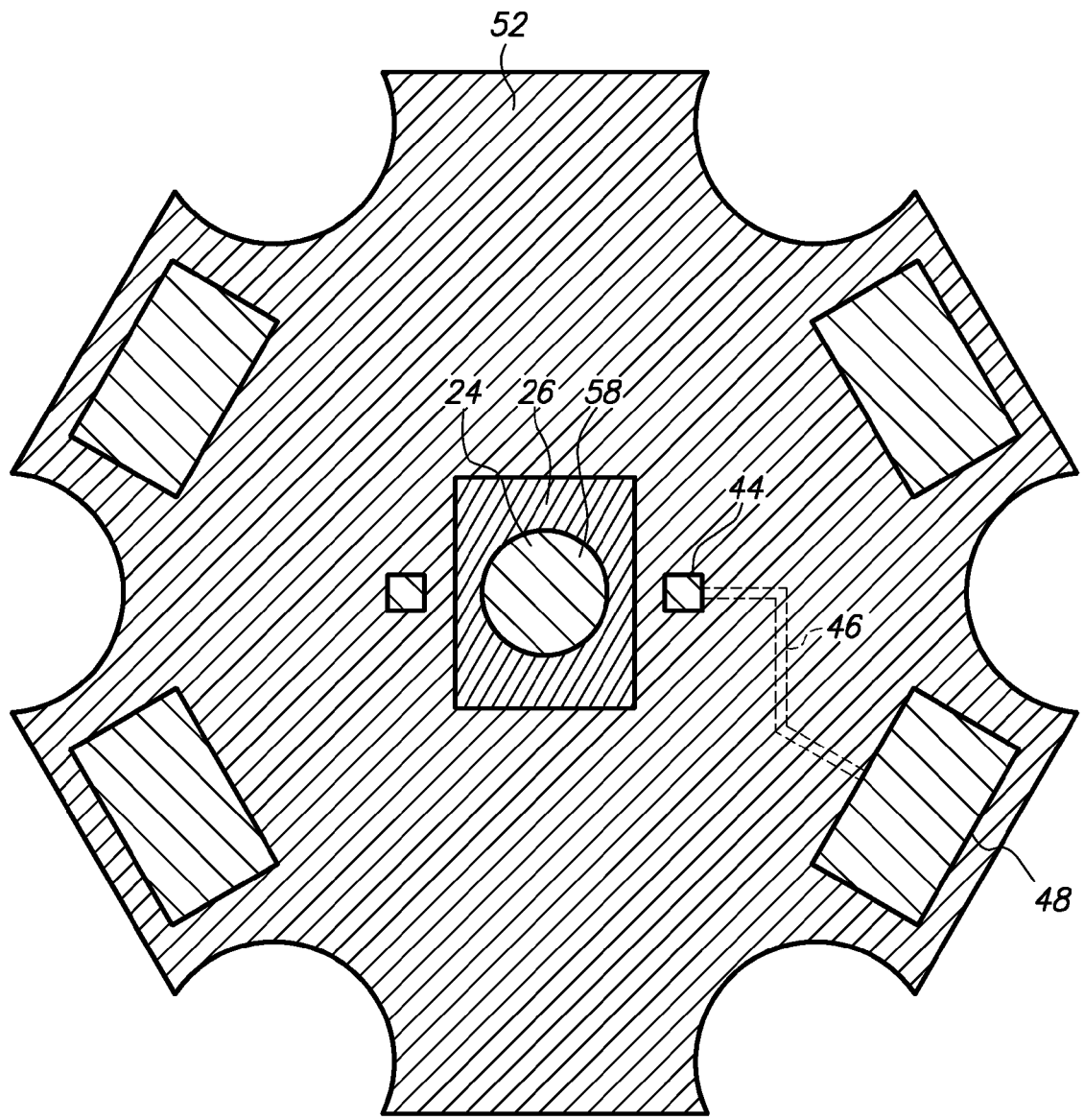
Figure 6C:
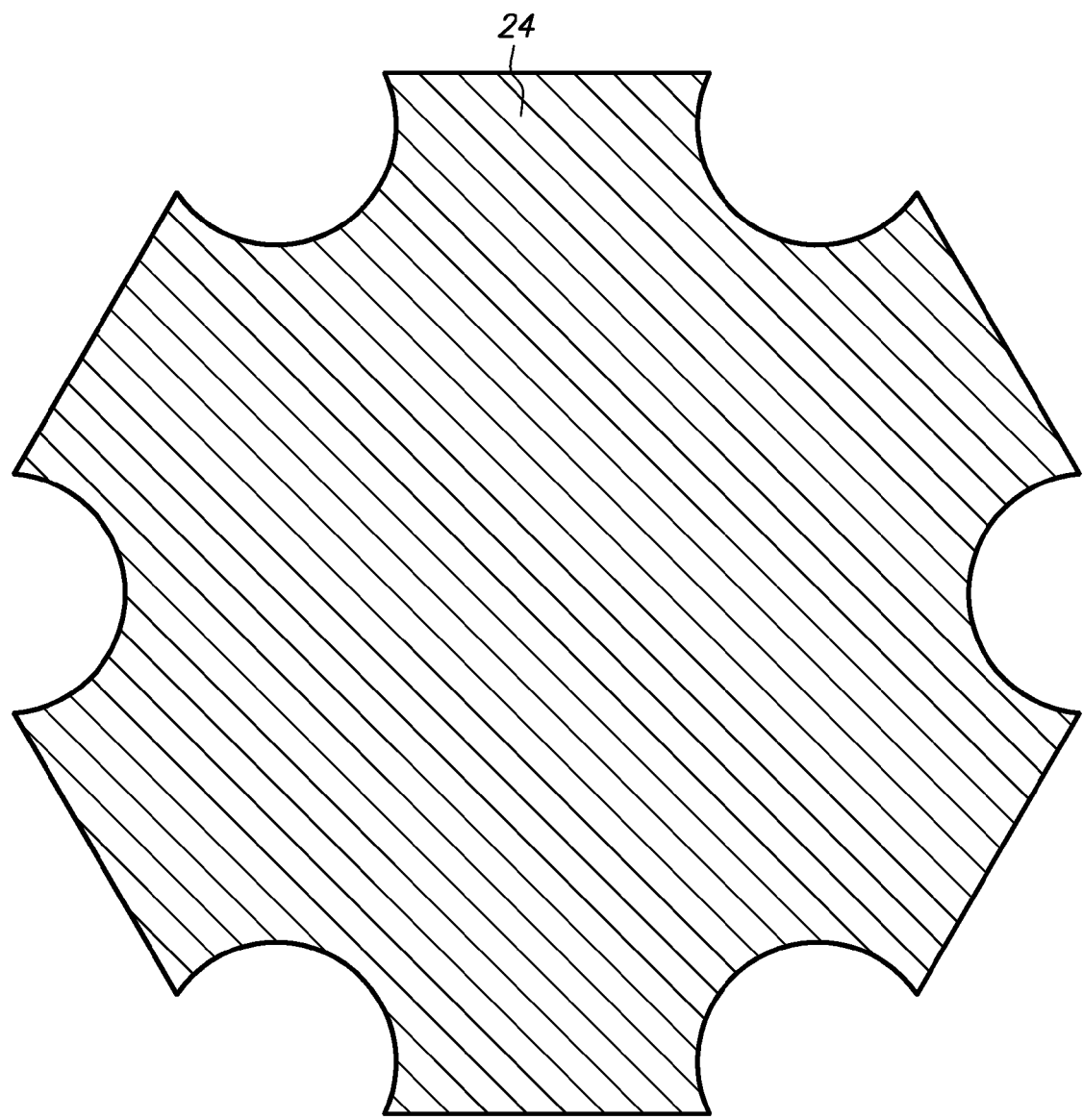

FIGS. 6A, 6B and 6C are cross-sectional, top and bottom views, respectively, of a thermal board with a conductive trace on an adhesive in accordance with an embodiment of the present invention.

In this embodiment, the conductive trace contacts the adhesive and the dielectric layer is omitted. For purposes of brevity, any description of thermal board 64 is incorporated herein insofar as the same is applicable, and the same description need not be repeated. Likewise, elements of the thermal board similar to those in thermal board 64 have corresponding reference numerals.

Thermal board 68 includes adhesive 26, conductive trace 50, solder mask 52 and heat spreader 60. Conductive trace 50 includes pad 44, routing line 46 and terminal 48. Heat spreader 60 includes base 24.

Conductive layer 32 is thicker in this embodiment than the previous embodiment. For instance, conductive layer 32 has a thickness of 130 microns (rather than 45 microns) so that it can be handled without warping or wobbling. Pad 44, routing line 46 and terminal 48 are therefore thicker and contact and overlap adhesive 26, and thermal board 68 is devoid of a dielectric layer corresponding to dielectric layer 34.

Thermal board 68 can be manufactured in a manner similar to thermal board 64 with suitable adjustments for post 22 and conductive layer 32. For instance, post 22 has a height of 250 microns (rather than 300 microns) so that base 24 has a thickness of 250 microns (rather than 200 microns). This can be accomplished by reducing the etch time. Thereafter, adhesive 26 is mounted on base 24, conductive layer 32 alone is mounted on adhesive 26, heat and pressure are applied to flow and solidify adhesive 26 and then grinding is applied to planarize the top surface as previously described. Thereafter, conductive layer 32 is etched to form pad 44, routing line 46 and terminal 48, solder mask 52 is formed on the top surface to expose post 22, pad 44 and terminal 48, then post 22 and base 24 are etched to form cavity 58 and then plated contacts 62 provide a surface finish for base 24, pad 44 and terminal 48.

Figure 7A:
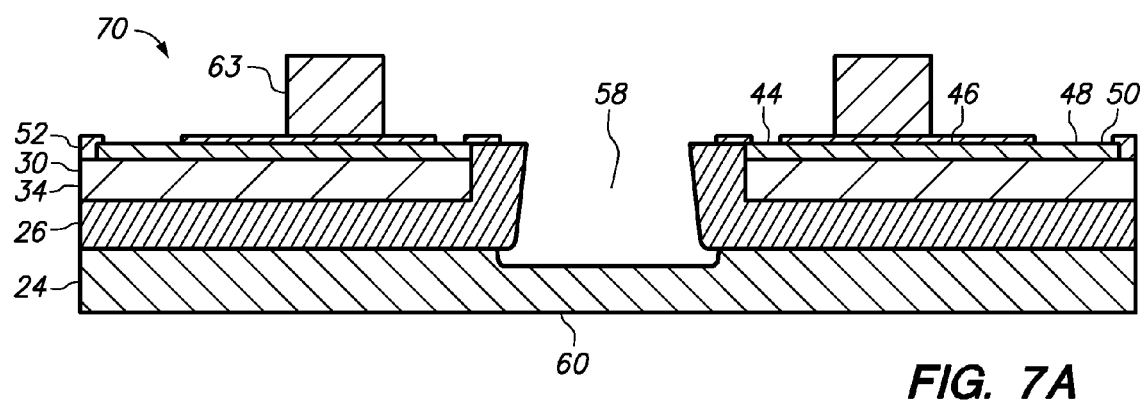
FIGS. 7A, 7B and 7C are cross-sectional, top and bottom views, respectively, of a thermal board with a rim in accordance with an embodiment of the present invention.
Figure 7B:
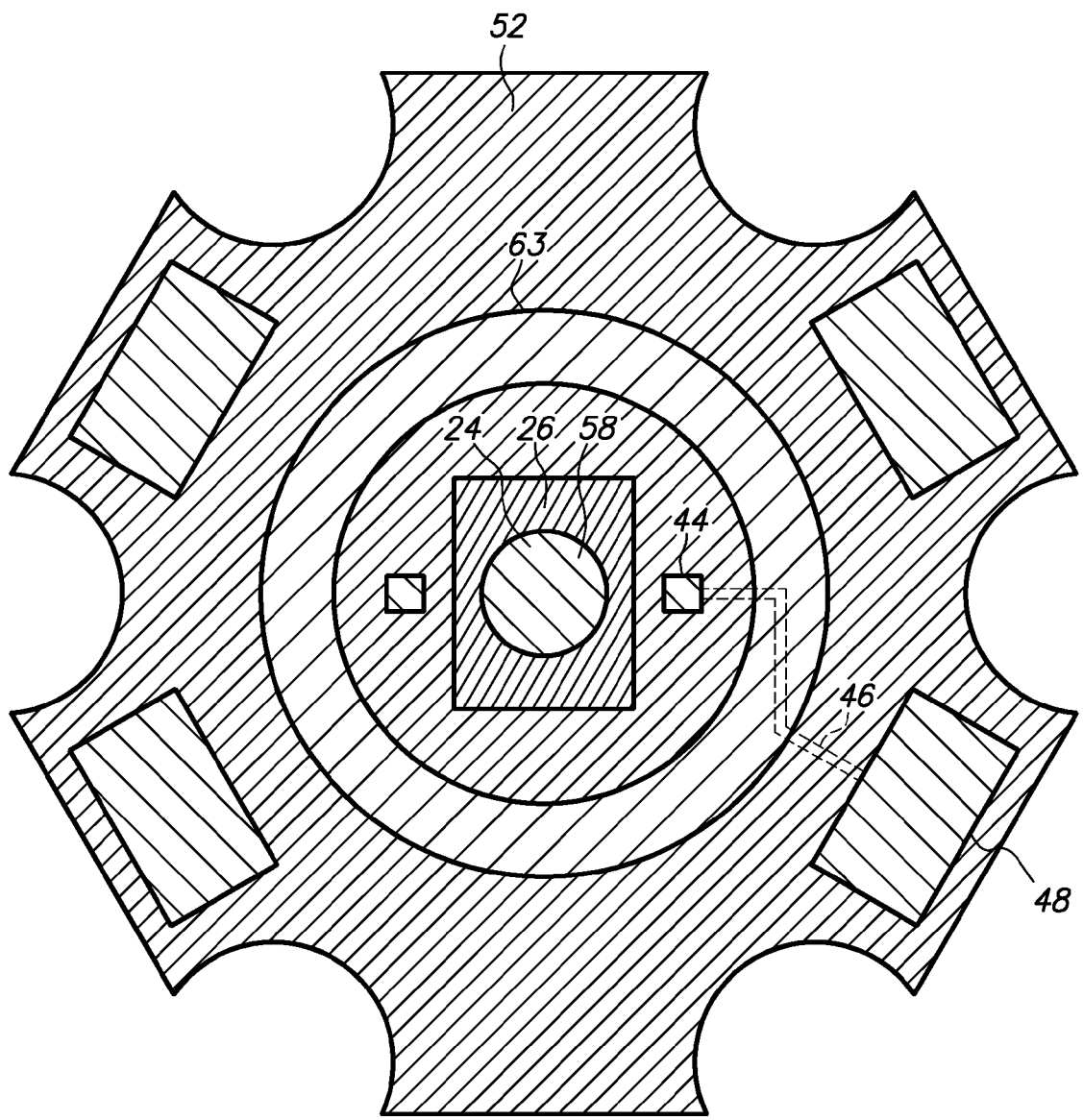
Figure 7C:
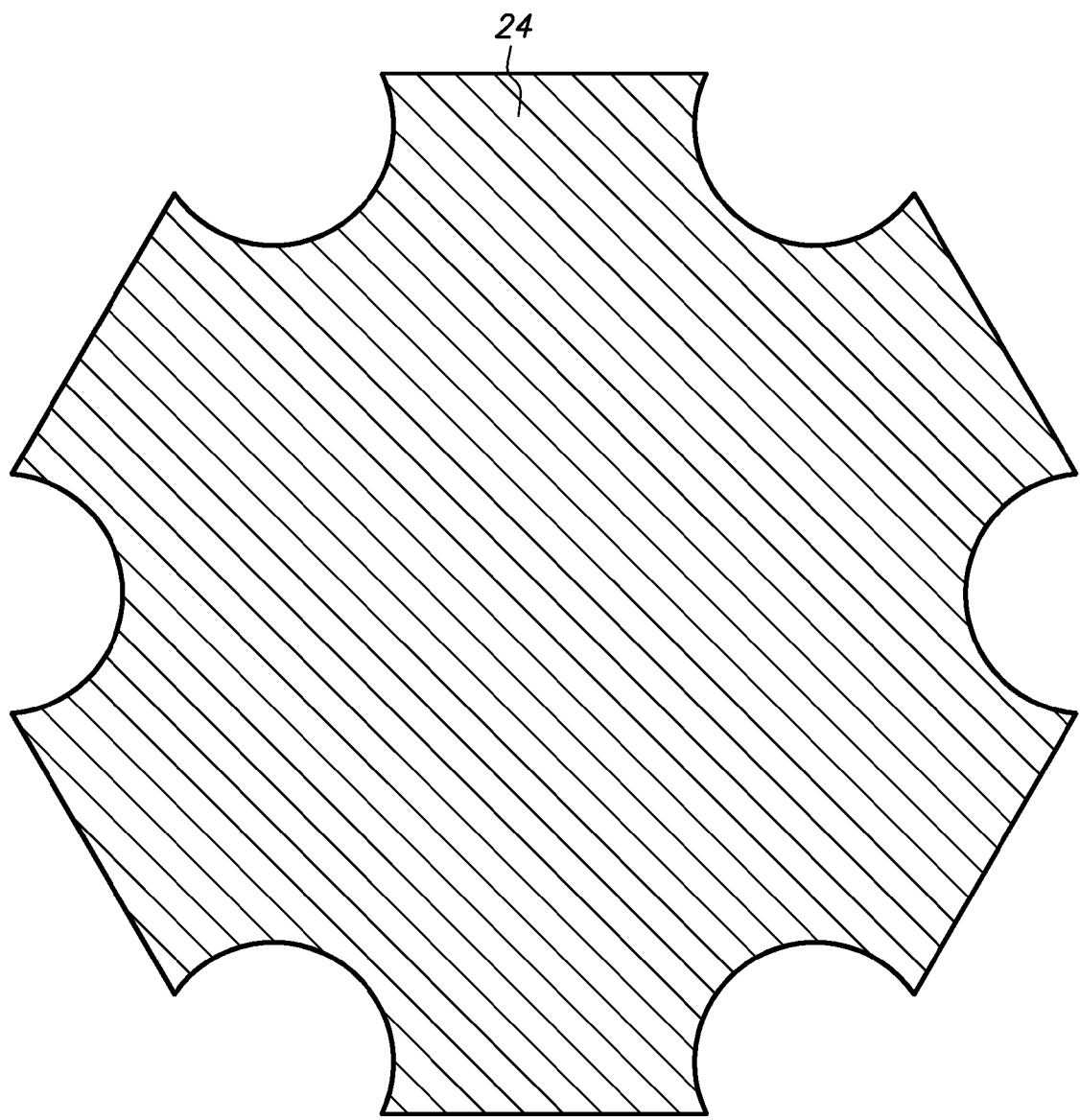

FIGS. 7A, 7B and 7C are cross-sectional, top and bottom views, respectively, of a thermal board with a rim in accordance with an embodiment of the present invention.

In this embodiment, a rim is mounted on the solder mask. For purposes of brevity, any description of thermal board 64 is incorporated herein insofar as the same is applicable, and the same description need not be repeated Likewise, elements of the thermal board similar to those in thermal board 64 have corresponding reference numerals.

Thermal board 70 includes adhesive 26, substrate 30, conductive trace 50, solder mask 52, heat spreader 60 and rim 63. Substrate 30 includes dielectric layer 34. Conductive trace 50 includes pad 44, routing line 46 and terminal 48. Heat spreader 60 includes post 22 and base 24.

Rim 63 is an annular ring that contacts and extends above solder mask 52. Cavity 58 is centrally located within the periphery of rim 63, pad 44 is located within the periphery of rim 63, routing line 46 extends within and outside the periphery of rim 63 and terminal 48 is located outside the periphery of rim 63. For instance, rim 63 has a height of 600 microns, a width (between its inner and outer circular sidewalls) of 1000 microns and is laterally spaced from cavity 58 by 500 microns.

Rim 63 includes a solder mask, a laminate and an adhesive film shown as a single layer for convenience of illustration. The solder mask contacts and extends above the laminate and provides the top surface, the adhesive film contacts and extends below the laminate and provides the bottom surface, and the laminate contacts and is sandwiched between and laminated to the solder mask and adhesive film. The solder mask, laminate and adhesive film are electrical insulators. For instance, the solder mask has a thickness of 50 microns, the laminate has a thickness of 500 microns, and the adhesive film has thickness of 50 microns. Thus, rim 63 has a height of 600 microns (50+500+50).

The laminate can be various dielectric films formed from numerous organic and inorganic electrical insulators. For instance, the laminate can be polyimide or FR-4 epoxy although other epoxies such as polyfunctional and bismaleimide triazine (BT) are suitable. Alternatively, rim 63 can include a metal ring on the adhesive film.

Thermal board 70 can be manufactured in a manner similar to thermal board 64 with suitable adjustments for rim 63. For instance, adhesive 26 is mounted on base 24, substrate 30 is mounted on adhesive 26, heat and pressure are applied to flow and solidify adhesive 26 and then grinding is applied to planarize the top surface as previously described. Thereafter, conductive layer 32 is etched to form pad 44, routing line 46 and terminal 48, solder mask 52 is formed on the top surface to expose post 22, pad 44 and terminal 48 and then post 22 and base 24 are etched to form cavity 58. Thereafter, rim 63 is mounted on solder mask 52 and then plated contacts 62 provide a surface finish for base 24, pad 44 and terminal 48.

Figure 8A:
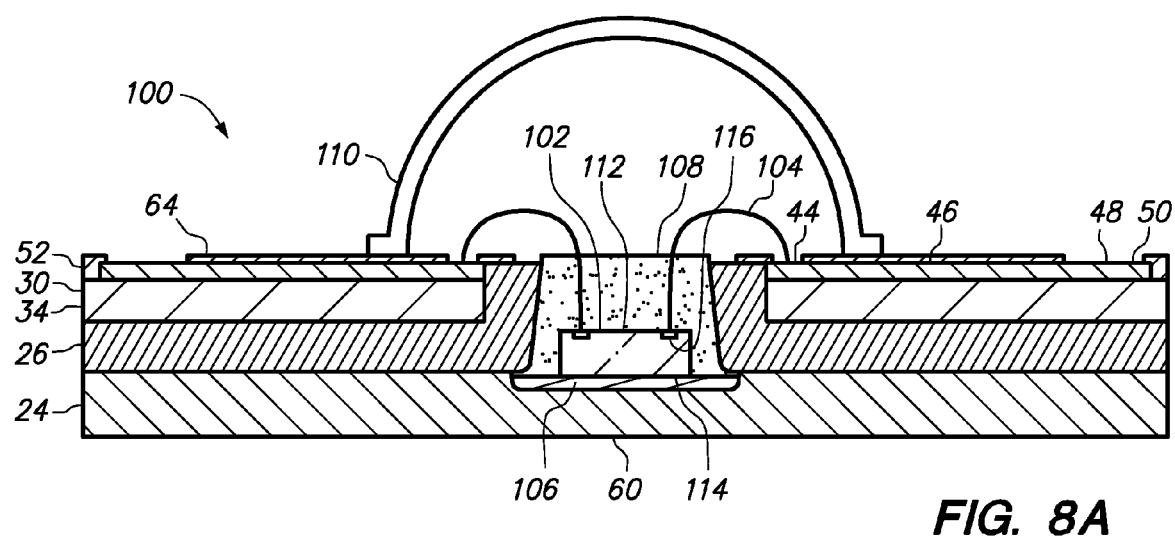
FIGS. 8A, 8B and 8C are cross-sectional, top and bottom views, respectively, of a semiconductor chip assembly that includes a thermal board, an LED chip, an encapsulant and a lens in accordance with an embodiment of the present invention.
Figure 8B:
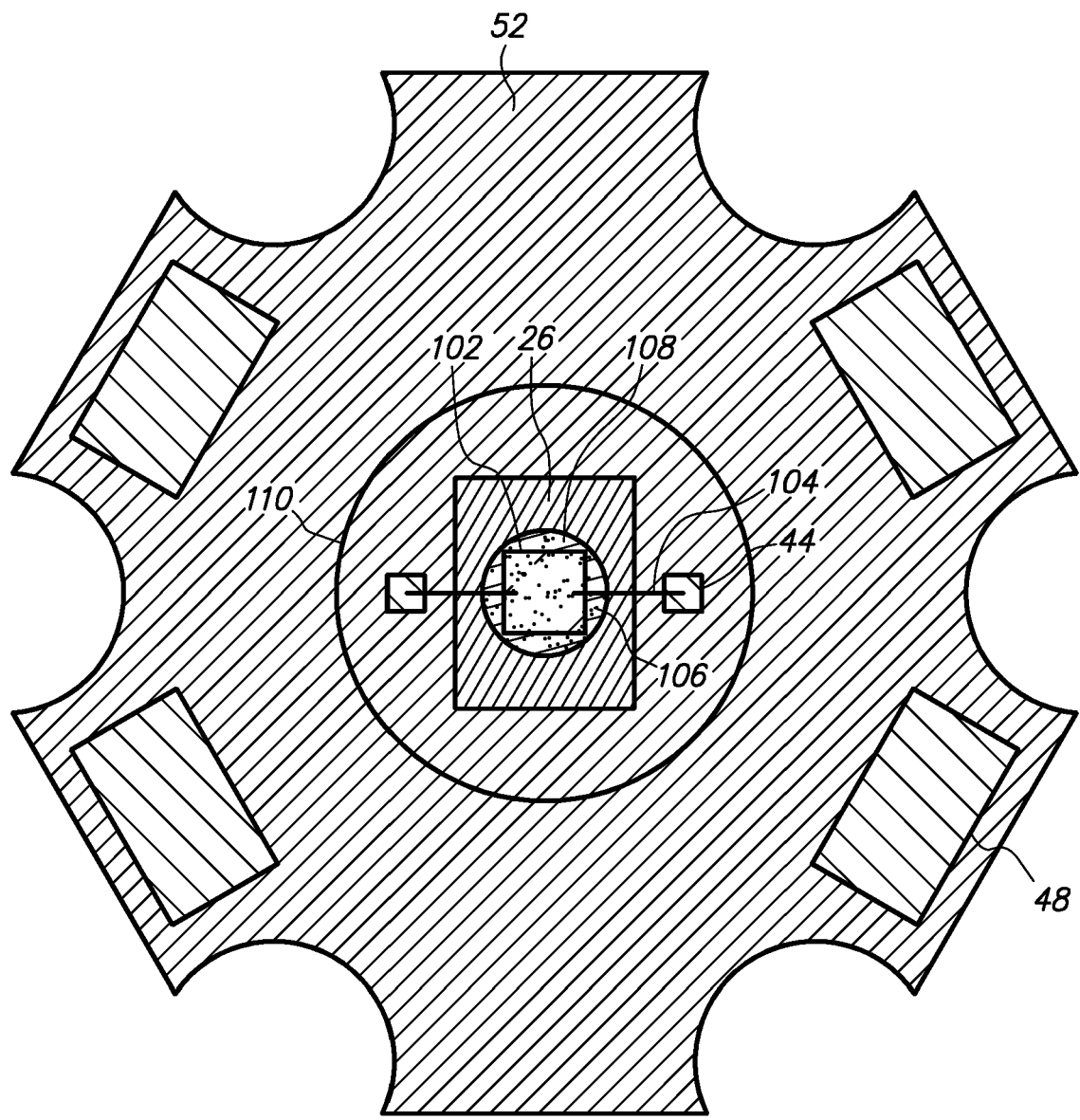
Figure 8C:
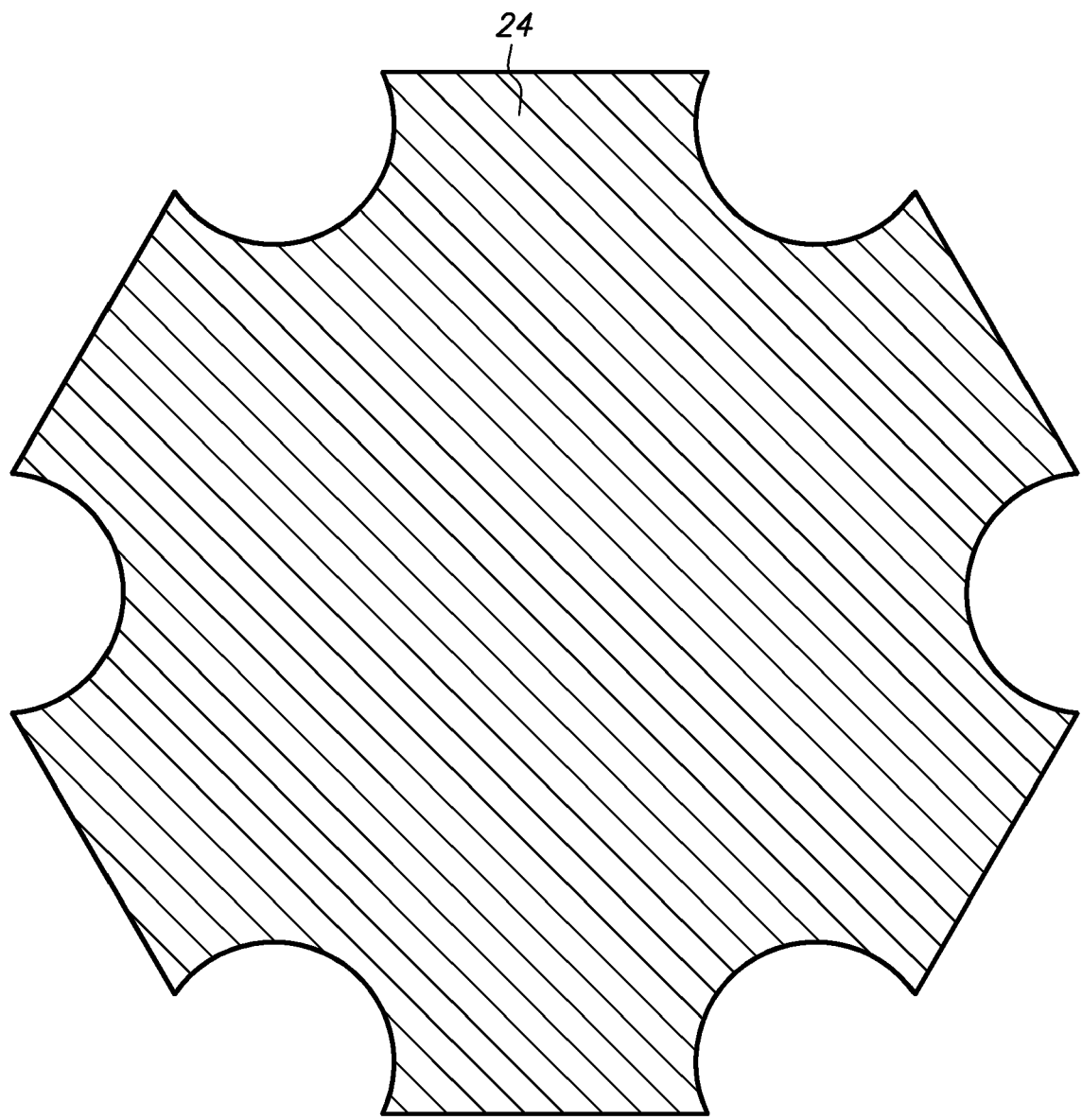

FIGS. 8A, 8B and 8C are cross-sectional, top and bottom views, respectively, of a semiconductor chip assembly that includes a thermal board, an LED chip that emits blue light, a color-shifting encapsulant that converts the blue light to white light and a transparent lens in accordance with an embodiment of the present invention.

Semiconductor chip assembly 100 includes thermal board 64, LED chip 102, wire bond 104, die attach 106, encapsulant 108 and lens 110. LED chip 102 includes top surface 112, bottom surface 114 and bond pad 116. Top surface 112 is the active surface and includes bond pad 116 and bottom surface 114 is the thermal contact surface.

LED chip 102 is mounted on heat spreader 60, electrically connected to substrate 30 and thermally connected to heat spreader 60. In particular, LED chip 102 is mounted on base 24 in cavity 58, overlaps base 24 but does not overlap adhesive 26 or substrate 30, is laterally surrounded by base 24 and adhesive 26, is electrically connected to substrate 30 by wire bond 104 and is thermally connected to and mechanically attached to heat spreader 60 by die attach 106. LED chip 102 is also mechanically attached to adhesive 26 and heat spreader 60 by encapsulant 108.

LED chip 102 and die attach 106 are located within cavity 58, wire bond 104 and encapsulant 108 extend within and outside cavity 58, and substrate 30, conductive trace 50 and lens 110 are located outside cavity 58. Wire bond 104 is bonded to and electrically connects pads 44 and 116, thereby electrically connecting LED chip 102 to terminal 48. Die attach 106 contacts and is sandwiched between and thermally connects and mechanically attaches base 24 and thermal contact surface 114, thereby thermally connecting LED chip 102 to base 24. Pad 44 is spot plated with nickel/silver to bond well with wire bond 104, thereby improving signal transfer from substrate 30 to LED chip 102, and base 24 is spot plated with nickel/silver to bond well with die attach 106, thereby improving heat transfer from LED chip 102 to heat spreader 60, and to provide a highly reflective surface which reflects the light emitted in the downward direction by LED chip 102, thereby increasing light output in the upward direction.

Encapsulant 108 is a solid adherent electrically insulative color-shifting protective enclosure that provides environmental protection such as moisture resistance and particle protection for LED chip 102. However, encapsulant 108 only partially protects wire bond 104.

Lens 110 is a transparent plastic lid with a curved hollow dome (resembling a hemisphere) that is mounted on solder mask 52 and provides environmental protection such as moisture resistance and particle protection for wire bond 104 and encapsulant 108 in a sealed enclosure.

LED chip 102 is located in cavity 58 below the top surface of adhesive 26. For instance, LED chip 102 has a thickness of 150 microns and die attach 106 has a thickness of 25 microns. As a result, the combined height of LED chip 102 (150 microns) and the underlying die attach 106 (25 microns) is 175 microns which is 135 microns less than the depth of cavity 58 (310 microns). LED chip 102 has a length and width of 1000 microns and is centrally located within cavity 58 and spaced from base 24 and adhesive 26.

Encapsulant 108 contacts adhesive 26, LED chip 102, wire bond 104 and die attach 106 in cavity 58, seals LED chip 102 within cavity 58, fills the remaining space in cavity 58 and covers cavity 58 and LED chip 102 in the upward direction. Encapsulant 108 extends above cavity 58 by 10 microns, is laterally confined by cavity 58 and is spaced from and does not overlap substrate 30, conductive trace 50 and solder mask 52.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor (shown as dots). For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light which in turn radiates through lens 110 and assembly 100 is a white light source. In addition, cavity 58 focuses the white light in the upward direction since the light emitted from LED chip 102 at its sidewalls (between surfaces 112 and 114) is directed at adhesive 26, and lens 110 provides a convex refractive surface that focuses the white light in the upward direction.

Semiconductor chip assembly 100 can be manufactured by mounting LED chip 102 on base 24 using die attach 106, then wire bonding pads 44 and 116, then forming encapsulant 108 and then mounting lens 110.

For instance, die attach 106 is initially a silver-filled epoxy paste with high thermal conductivity that is deposited into cavity 58 on base 24 by screen printing or dispensing by an injection nozzle in step-and-repeat fashion, and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 44 and 116. Thereafter, encapsulant 108 is deposited as an A-stage uncured epoxy into cavity 58 on LED chip 102 and wire bond 104 by screen printing or dispensing by an injection nozzle in step-and-repeat fashion. The liquid epoxy fills the remaining space in and extends slightly above and is laterally confined by cavity 58 which serves as a dam, and then the liquid epoxy is heated and hardened at a relatively low temperature such as 190° C., thereby converting the A-stage liquid uncured epoxy into C-stage cured or hardened epoxy. Finally, lens 110 is mounted on solder mask 52 using an adhesive (not shown).

LED chip 102 can be electrically connected to pad 44 by a wide variety of connection media, thermally connected to and mechanically attached to heat spreader 60 by a wide variety of thermal adhesives and encapsulated by a wide variety of encapsulants.

Semiconductor chip assembly 100 is a first-level single-chip package.

Figure 9A:
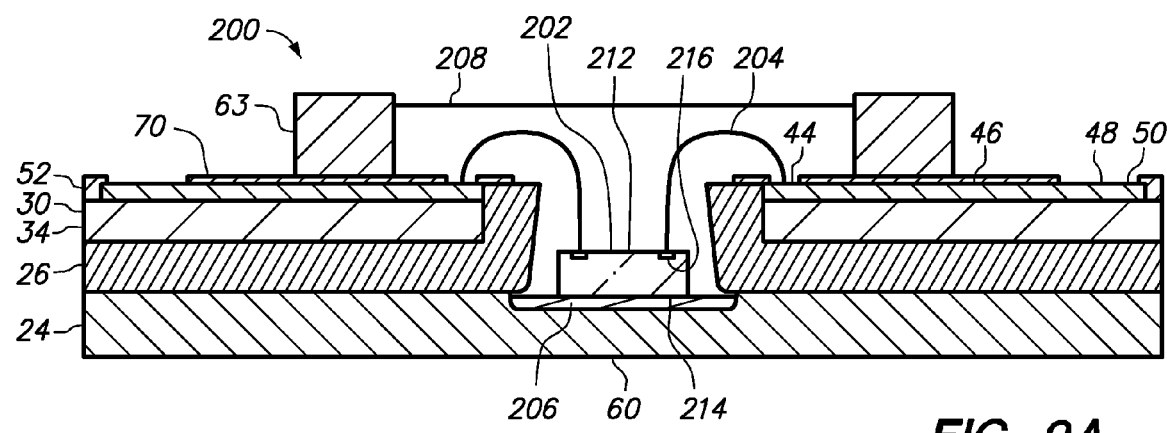
FIGS. 9A, 9B and 9C are cross-sectional, top and bottom views, respectively, of a semiconductor chip assembly that includes a thermal board, an LED chip and an encapsulant in accordance with an embodiment of the present invention.
Figure 9B:
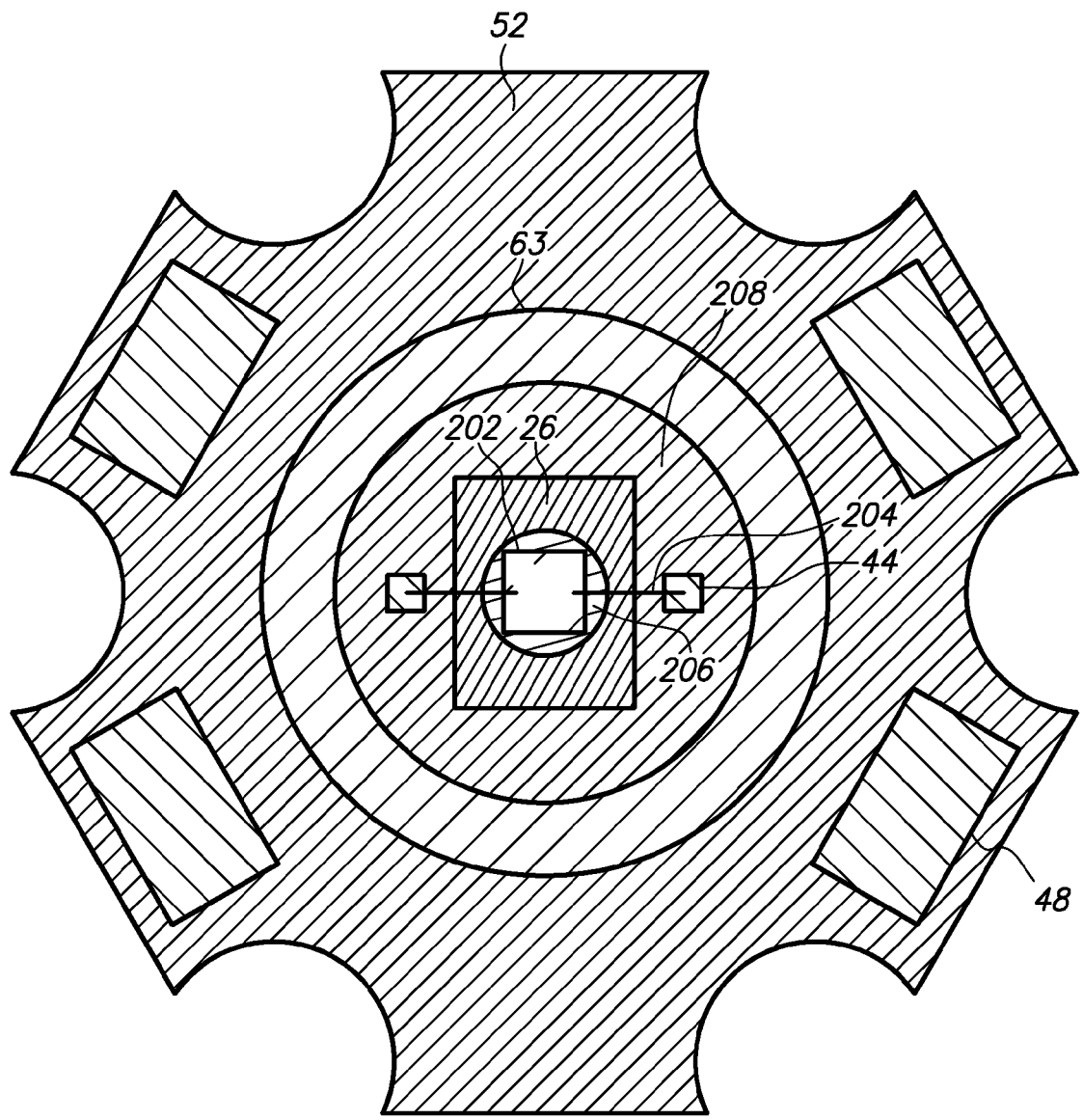
Figure 9C:
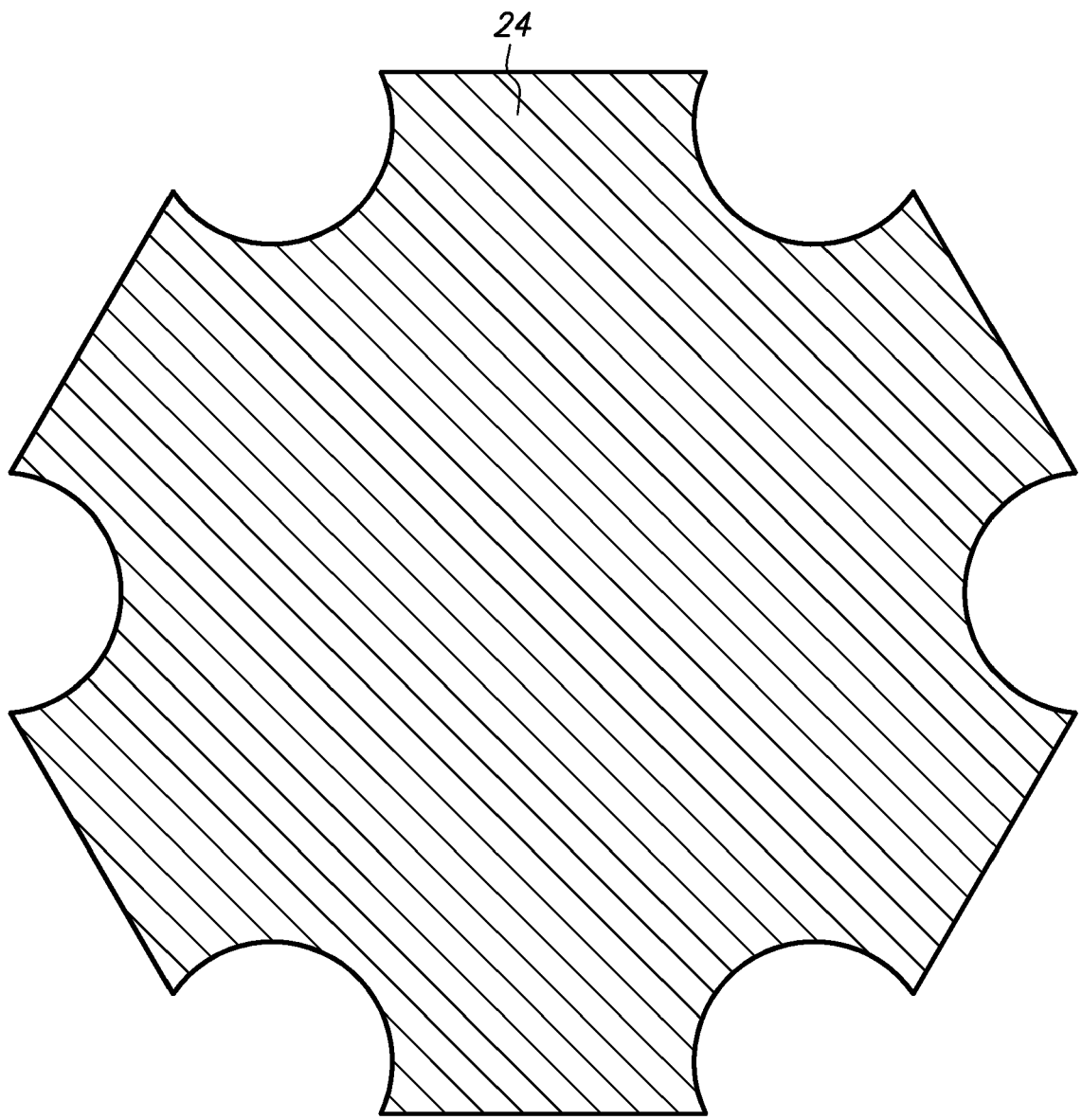

FIGS. 9A, 9B and 9C are cross-sectional, top and bottom views, respectively, of a semiconductor chip assembly that includes a thermal board, an LED chip that emits white light and a transparent encapsulant in accordance with an embodiment of the present invention.

In this embodiment, the LED chip emits white light rather than blue light and the encapsulant is transparent rather than color-shifting. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 202 corresponds to LED chip 102, wire bond 204 corresponds to wire bond 104, etc.

Semiconductor chip assembly 200 includes thermal board 70, LED chip 202, wire bond 204, die attach 206 and encapsulant 208. LED chip 202 includes top surface 212, bottom surface 214 and bond pad 216. Top surface 212 is the active surface and includes bond pad 216 and bottom surface 214 is the thermal contact surface.

LED chip 202 is mounted on heat spreader 60, electrically connected to substrate 30 and thermally connected to heat spreader 60. In particular, LED chip 202 is mounted on base 24 in cavity 58, is electrically connected to substrate 30 by wire bond 204, is thermally connected to and mechanically attached to heat spreader 60 by die attach 206 and is mechanically attached to adhesive 26 and heat spreader 60 by encapsulant 208.

LED chip 202 and die attach 206 are located within cavity 58, and wire bond 204 and encapsulant 208 extend within and outside cavity 58. Wire bond 204 is bonded to and electrically connects pads 44 and 216, and die attach 206 contacts and is sandwiched between and thermally connects and mechanically attaches base 24 and thermal contact surface 214.

Encapsulant 208 contacts adhesive 26, LED chip 202, wire bond 204 and die attach 206 in cavity 58, contacts adhesive 26, conductive trace 50, solder mask 52, rim 63 and wire bond 204 outside cavity 58, extends laterally from cavity 58 to and is laterally confined by rim 63 and has a height of 500 microns above solder mask 52. Encapsulant 208 seals LED chip 202 within cavity 58, fills the remaining space in cavity 58 and covers LED chip 202 and wire bond 204 in the upward direction. As a result, encapsulant 208 protects not only LED chip 202 but also wire bond 204.

LED chip 202 emits white light rather than blue light. Encapsulant 208 includes transparent silicone but is devoid of fluorescent powder and does not color-shift the white light. Moreover, encapsulant 208 need not contain phosphor or fluorescent powder, and therefore using more encapsulant 208 than encapsulant 108 is still cost effective.

Semiconductor chip assembly 200 can be manufactured by mounting LED chip 202 on base 24 using die attach 206, then wire bonding pads 44 and 216 and then forming encapsulant 208 using rim 63 as a dam.

Semiconductor chip assembly 200 is a first-level single-chip package.

Figure 10A:
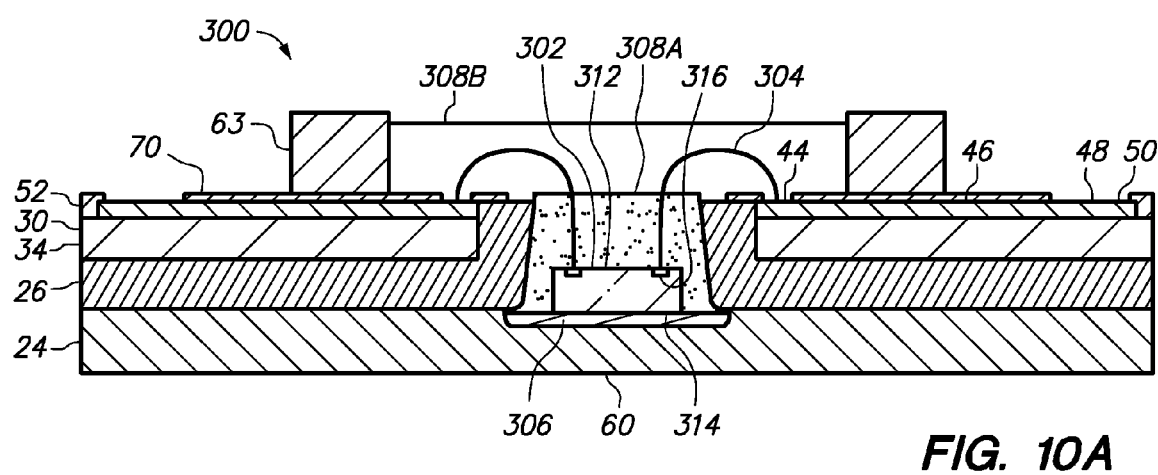
FIGS. 10A, 10B and 10C are cross-sectional, top and bottom views, respectively, of a semiconductor chip assembly that includes a thermal board, an LED chip and dual encapsulants in accordance with an embodiment of the present invention.
Figure 10B:
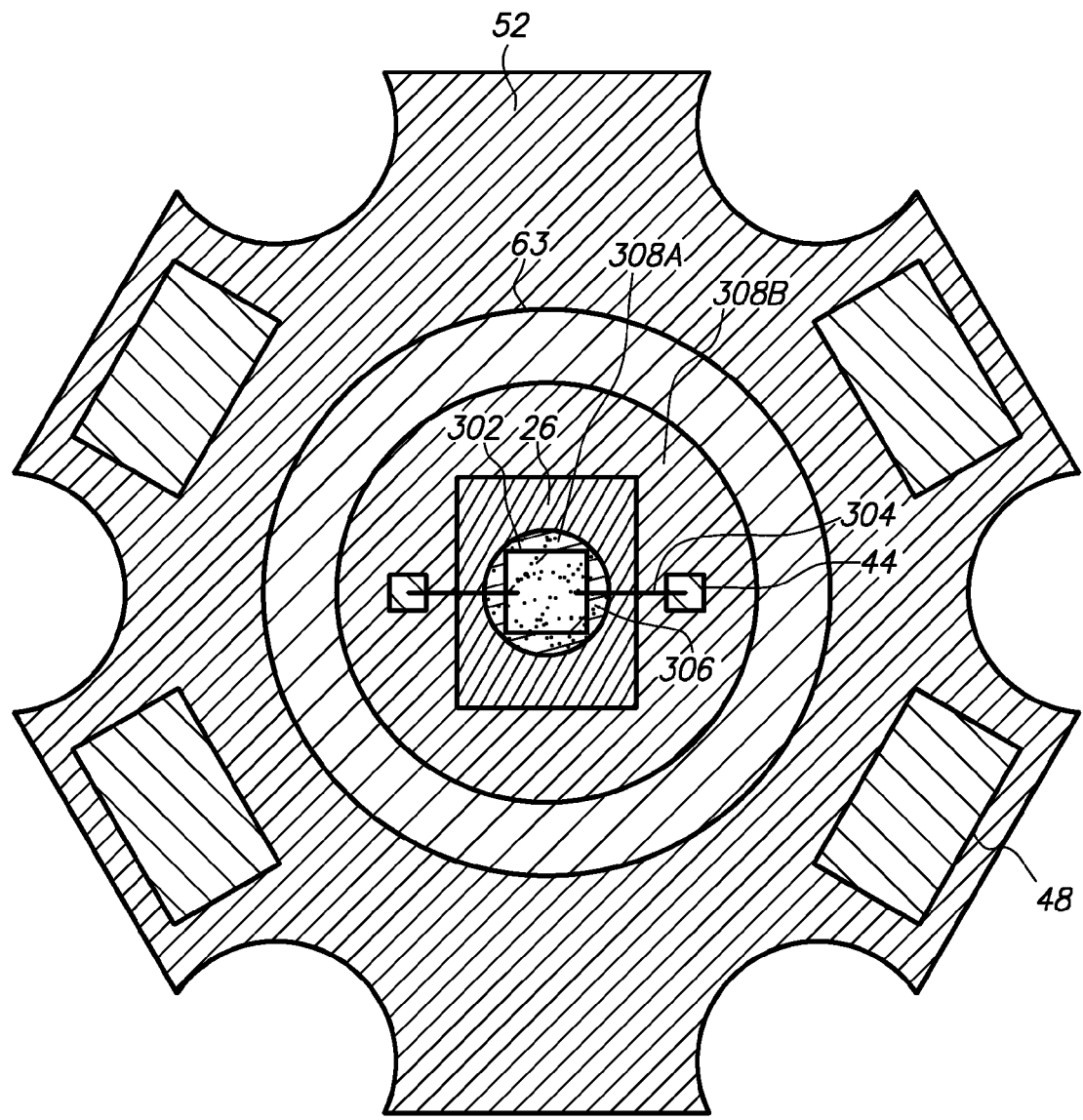
Figure 10C:
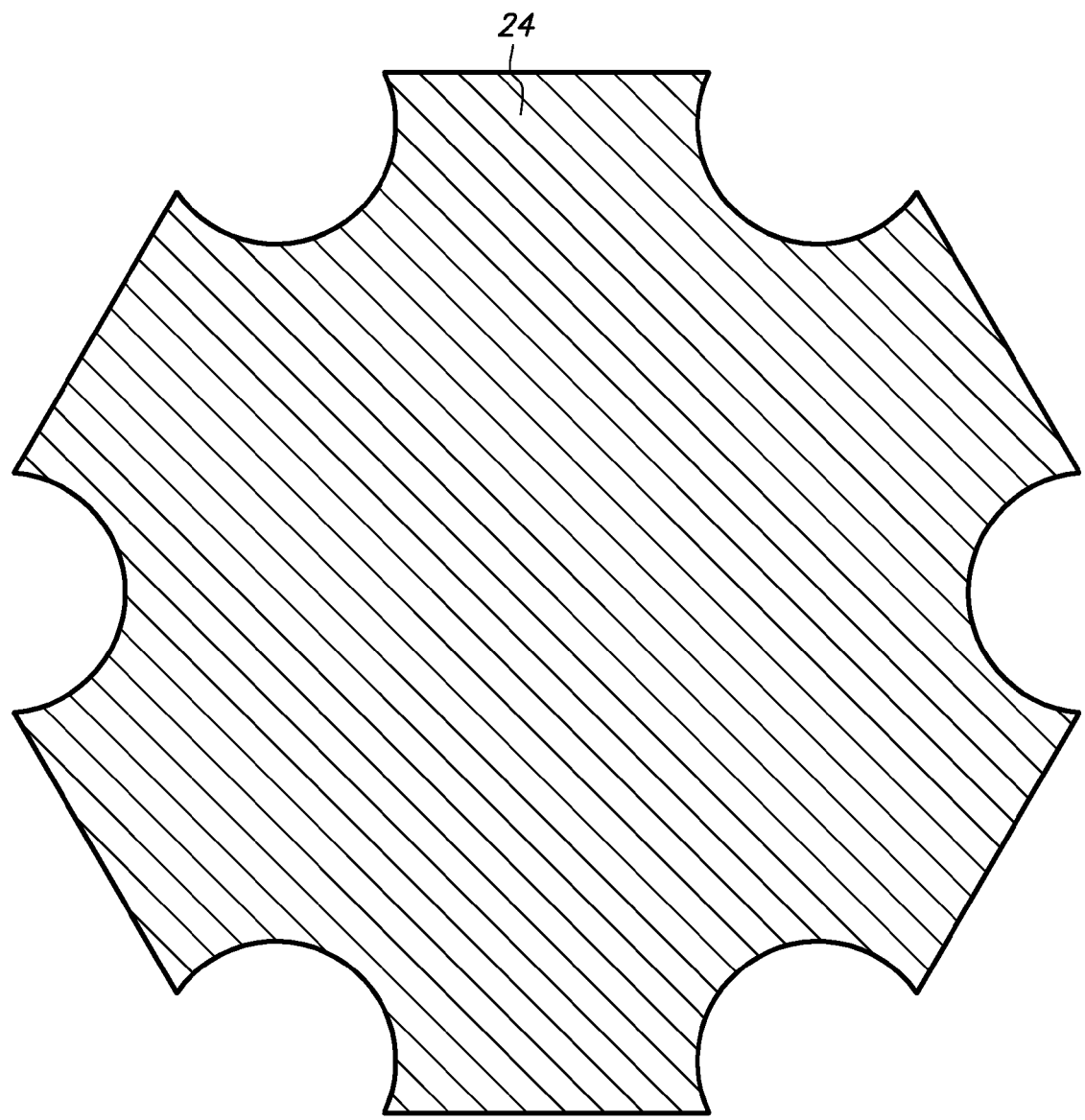

FIGS. 10A, 10B and 10C are cross-sectional, top and bottom views, respectively, of a semiconductor chip assembly that includes a thermal board, an LED chip that emits blue light, a color-shifting encapsulant and a transparent encapsulant in accordance with an embodiment of the present invention.

In this embodiment, the transparent encapsulant rather than the lens is provided over the wire bond and the color-shifting encapsulant. For purposes of brevity, any description of assemblies 100 and 200 is incorporated herein insofar as the same is applicable, and the same description need not be repeated Likewise, elements of the assembly similar to those in assemblies 100 and 200 have corresponding reference numerals indexed at three-hundred rather than one-hundred and two-hundred. For instance, LED chip 302 corresponds to LED chip 102, wire bond 304 corresponds to wire bond 104, encapsulant 308A corresponds to encapsulant 108 and encapsulant 308B corresponds to encapsulant 208.

Semiconductor chip assembly 300 includes thermal board 70, LED chip 302, wire bond 304, die attach 306 and encapsulants 308A and 308B. LED chip 302 includes top surface 312, bottom surface 314 and bond pad 316. Top surface 312 is the active surface and includes bond pad 316 and bottom surface 314 is the thermal contact surface.

LED chip 302 is mounted on heat spreader 60, electrically connected to substrate 30 and thermally connected to heat spreader 60. In particular, LED chip 302 is mounted on base 24 in cavity 58, is electrically connected to substrate 30 by wire bond 304, is thermally connected to and mechanically attached to heat spreader 60 by die attach 306 and is mechanically attached to adhesive 26 and heat spreader 60 by encapsulant 308A.

LED chip 302 and die attach 306 are located within cavity 58, wire bond 304 and encapsulant 308A extend within and outside cavity 58, and encapsulant 308B is located outside cavity 58. Wire bond 304 is bonded to and electrically connects pads 44 and 316, die attach 306 contacts and is sandwiched between and thermally connects and mechanically attaches base 24 and thermal contact surface 314, encapsulant 308A contacts and is sandwiched between LED chip 302 and encapsulant 308B, and encapsulant 308B contacts adhesive 26, conductive trace 50, solder mask 52, rim 63, wire bond 304 and encapsulant 308A and covers LED chip 302, wire bond 304 and encapsulant 308A in the upward direction. As a result, encapsulant 308B protects not only LED chip 302 and wire bond 304 but also encapsulant 308A.

LED chip 302 emits blue light, color-shifting encapsulant 308A converts the blue light to white light which in turn radiates through transparent encapsulant 308B and assembly 300 is a white light source.

Semiconductor chip assembly 300 can be manufactured by mounting LED chip 302 on base 24 using die attach 306, then wire bonding pads 44 and 316, then forming encapsulant 308A using cavity 58 as a dam and then forming encapsulant 308B using rim 63 as a dam.

Semiconductor chip assembly 300 is a first-level single-chip package.

Figure 11A:
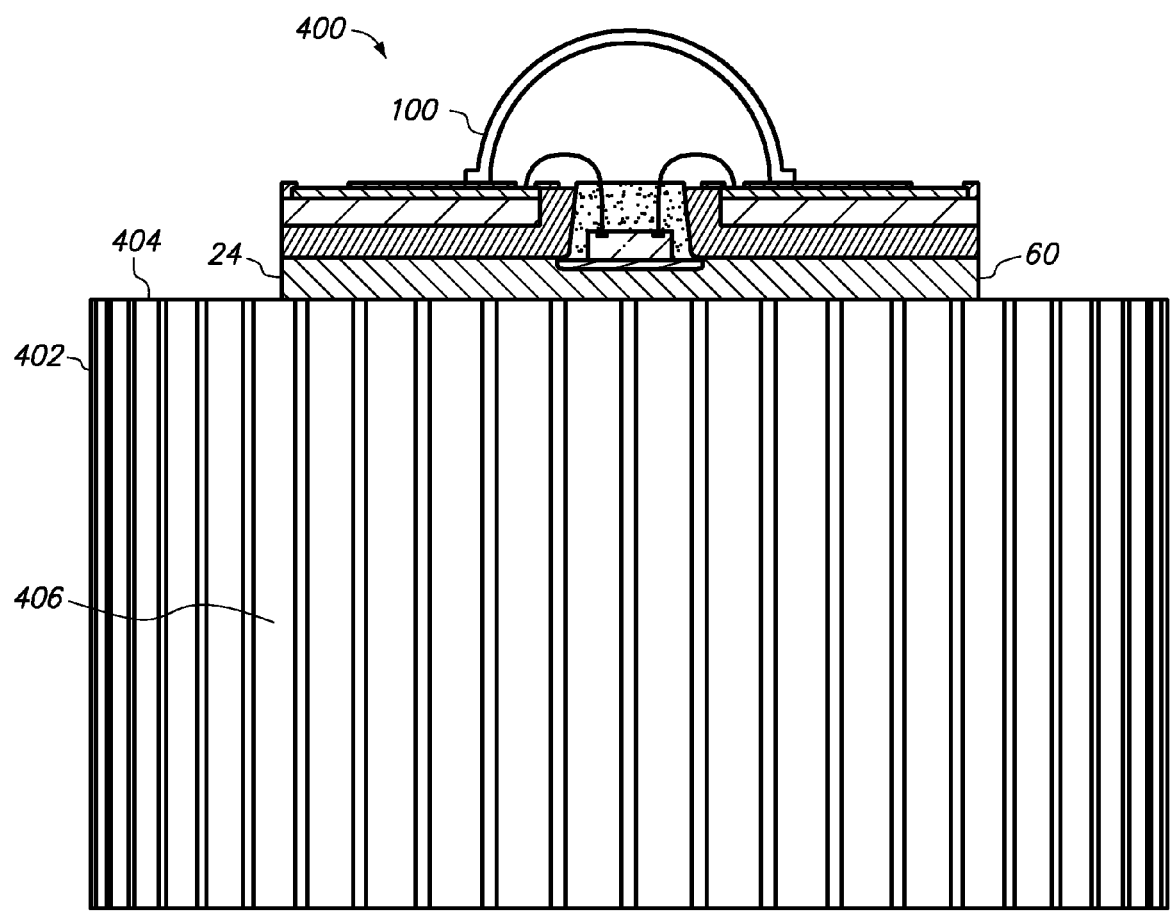
FIGS. 11A, 11B and 11C are cross-sectional, top and bottom views, respectively, of a light source subassembly that includes a semiconductor chip assembly and a heat sink in accordance with an embodiment of the present invention.
Figure 11B:
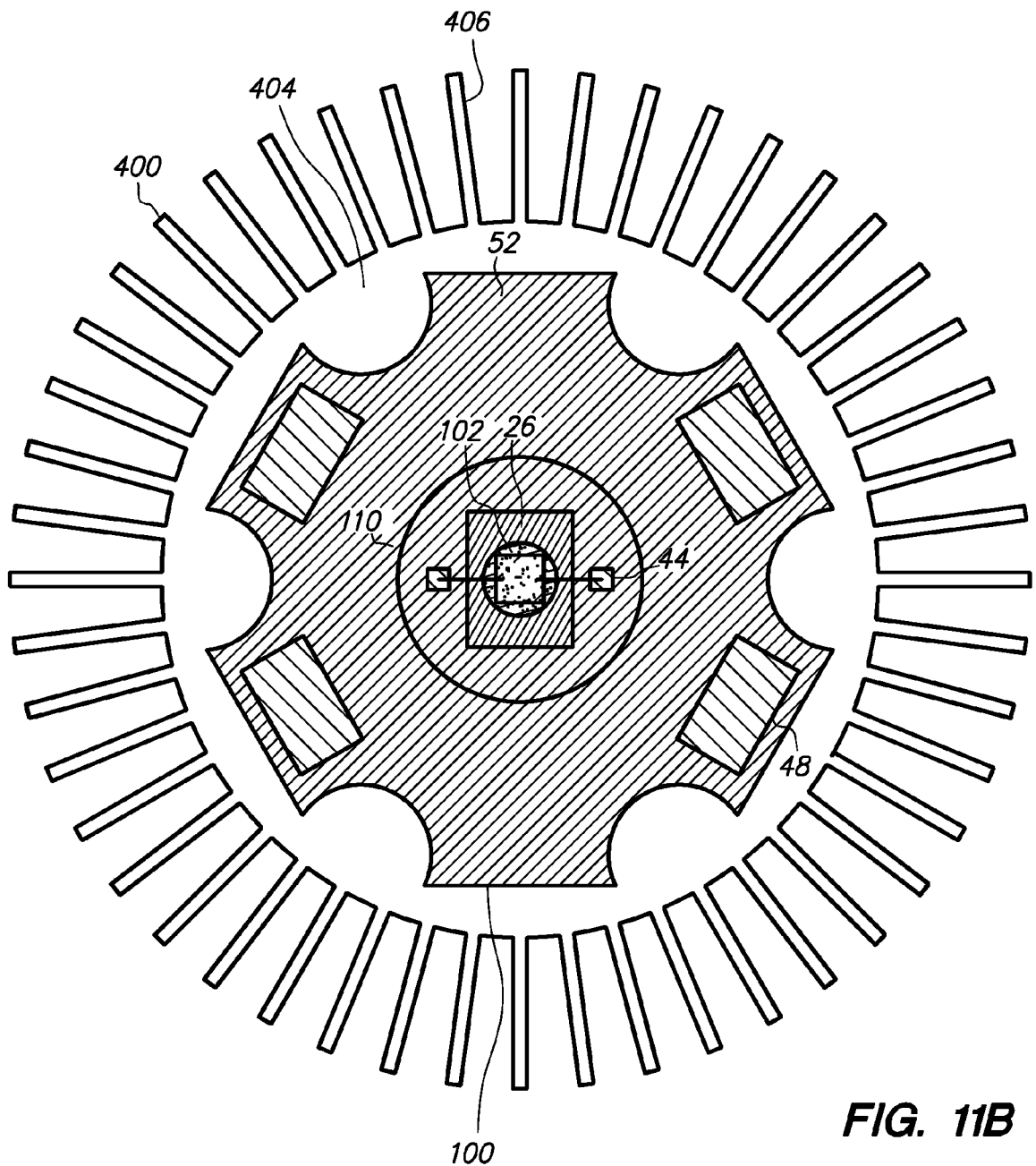
Figure 11C:
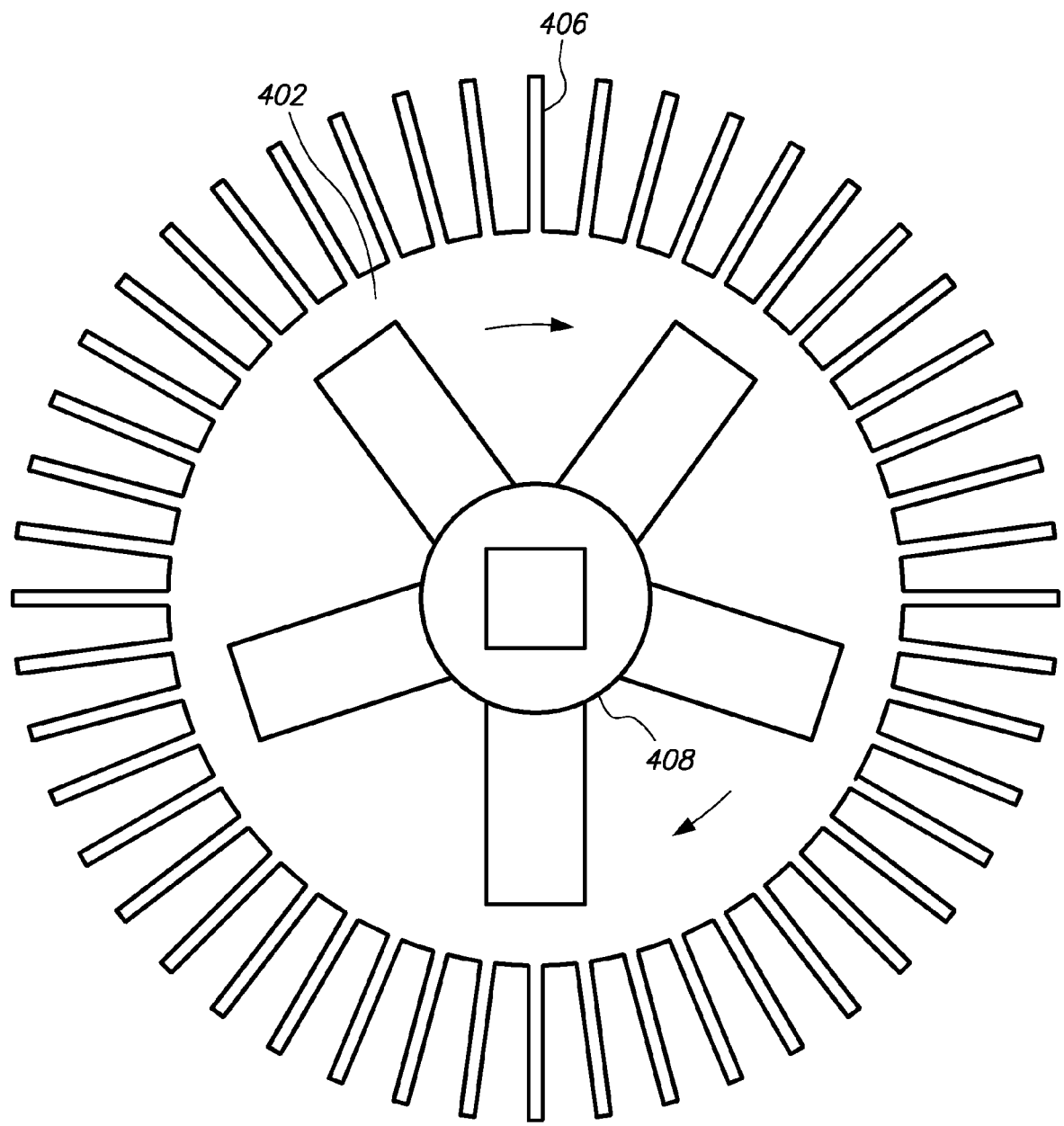

FIGS. 11A, 11B and 11C are cross-sectional, top and bottom views, respectively, of a light source subassembly that includes a semiconductor chip assembly and a heat sink in accordance with an embodiment of the present invention.

Light source subassembly 400 includes semiconductor chip assembly 100 and heat sink 402. Heat sink 402 includes thermal contact surface 404, fins 406 and fan 408. Assembly 100 is mounted on heat sink 402 and mechanically fastened to heat sink 402, for instance by screws (not shown). As a result, base 24 is clamped against and thermally connected to thermal contact surface 404, thereby thermally connecting heat spreader 60 to heat sink 402. Heat spreader 60 spreads the heat from LED chip 102 and transfers the spread heat to heat sink 402, which in turn dissipates the heat into the exterior environment using fins 406 and fan 408.

Light source subassembly 400 is designed for a light fixture (not shown) that is interchangeable with a standard incandescent light bulb. The light fixture includes subassembly 400, a glass cap, a threaded base, a control board, wiring and a housing. Subassembly 400, the control board and the wiring are enclosed within the housing. The wiring extends from the control board and is soldered to terminals 48. The glass cap and the threaded base protrude from opposite ends of the housing. The glass cap exposes LED chip 102, the threaded base is configured to screw into a light socket and the control board is electrically connected to terminals 48 by the wiring. The housing is a two-piece plastic shell with top and bottom pieces. The glass cap is attached to and protrudes above the top piece, the threaded base is attached to and protrudes below the bottom piece, and subassembly 400 and the control board are mounted on the bottom piece and extend into the top piece.

During operation, the threaded base transfers AC from a light socket to the control board, which converts the AC to modulated DC and the wiring transmits the modulated DC to terminal 48 and grounds another terminal 48. As a result, LED chip 102 illuminates bright blue light which encapsulant 108 converts to white light that radiates through the glass cap. LED chip 102 also generates intense localized heat that flows into and is spread by heat spreader 60 and flows from heat spreader 60 into heat sink 402 where fins 406 heat the air, and fan 408 blows the hot air radially outward through slots in the housing into the external environment.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the semiconductor device can be an LED package and the thermal board can provide vertical signal routing. The substrate can include single-level conductive traces and multi-level conductive traces. The thermal board can include multiple cavities arranged in an array for multiple semiconductor devices and can include additional conductive traces to accommodate the additional semiconductor devices Likewise, the semiconductor device can be an LED package with multiple LED chips and the thermal board can include additional conductive traces to accommodate the additional LED chips. A color-shifting encapsulant can extend laterally from the cavity and cover the wire bond and a transparent encapsulant can be laterally confined to the cavity and not cover the wire bond.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the base and the substrate can include additional conductive traces to receive and route additional wire bonds to the chips. This may be more cost effective than providing a miniature cavity for each chip.

The semiconductor device can extend into the cavity. For instance, the semiconductor device can extend into and slightly above the cavity. In this instance, most but not all of the semiconductor device is located inside the cavity and the semiconductor device extends within and outside the cavity. Alternatively, the semiconductor device can be located within the cavity. In this instance, all of the semiconductor device is located inside the cavity. In any case, the semiconductor device extends into the cavity regardless of whether most or all of the semiconductor device is located within the cavity.

The semiconductor chip can be optical or non-optical. For instance, the chip can be an LED, a solar cell, a microprocessor, a controller or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can consist of the base, thereby enhancing reliability and reducing cost. Furthermore, the cavity can be customized for the semiconductor device and the base can be customized for the next level assembly, thereby enhancing the thermal connection from the semiconductor device to the next level assembly. For instance, if the opening and aperture are punched rather than drilled then the post and the cavity can have a square or rectangular shape in a lateral plane with the same or similar topography as the thermal contact of the semiconductor device.

The heat spreader can be electrically connected to or isolated from the semiconductor device and the substrate. For instance, the die attach can be electrically conductive. Thereafter, the heat spreader can be electrically connected to ground, thereby electrically connecting the semiconductor device to ground.

The heat spreader can be copper, aluminum, copper/nickel/aluminum or other thermally conductive metallic structures.

The base can provide mechanical support for the substrate. For instance, the base can prevent the substrate from warping during metal grinding, chip mounting, wire bonding and encapsulant curing. The base can also cover the assembly in the downward direction when the terminal is above the dielectric layer, or alternatively, be spaced from the peripheral edges of the assembly when the terminal is below the adhesive. Furthermore, the base can include fins at its backside that protrude in the downward direction. For instance, the base can be cut at its bottom surface by a routing machine to form lateral grooves that define the fins. In this instance, the base can have a thickness of 700 microns, the grooves can have a depth of 500 microns and the fins can have a height of 500 microns. The fins can increase the surface area of the base, thereby increasing the thermal conductivity of the base by thermal convection when it remains exposed to the air rather than mounted on a heat sink.

The post and the base can be etched to form the cavity after the adhesive is solidified, either before, during or after the pad and/or the terminal is formed and before or after the solder mask is formed.

The adhesive can provide a robust mechanical bond between the heat spreader and the substrate. For instance, the adhesive can extend laterally from the cavity beyond the conductive trace to the peripheral edges of the assembly, the adhesive can fill the space between the heat spreader and the substrate and the adhesive can be void-free with consistent bond lines. The adhesive can also absorb thermal expansion mismatch between the heat spreader and the substrate. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the aperture can be formed in the conductive layer and then the conductive layer can be mounted on the adhesive so that the conductive layer contacts the adhesive and is exposed in the upward direction and the post extends into and is exposed in the upward direction by the aperture. In this instance, the conductive layer can have a thickness of 100 to 200 microns such as 125 microns which is thick enough to handle without warping and wobbling yet thin enough to pattern without excessive etching.

The conductive layer and the dielectric layer can be mounted on the adhesive. For instance, the conductive layer can be provided on the dielectric layer, then the aperture can be formed in the conductive layer and the dielectric layer, and then the conductive layer and the dielectric layer can be mounted on the adhesive so that the conductive layer is exposed in the upward direction, the dielectric layer contacts and is sandwiched between and separates the conductive layer and the adhesive and the post extends into and is exposed in the upward direction by the aperture. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the aperture can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the post is aligned with the aperture and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned to provide the conductive trace. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad, the terminal and the routing line over the dielectric layer can be formed by numerous deposition techniques including electroplating, electroless plating, evaporating and sputtering as a single layer or multiple layers, either before or after the substrate is mounted on the adhesive. For instance, the conductive layer can be patterned on the substrate before it is mounted on the adhesive or after it is attached to the post and the base by the adhesive.

The plated contact surface finish can be formed before or after the pad and the terminal are formed. For instance, the plated layer can be deposited on the conductive layer and then patterned using the etch mask that defines the pad and the terminal.

The rim can be reflective or non-reflective and transparent or non-transparent. For instance, the rim can include a highly reflective metal such as silver with a slanted inner surface which reflects the light directed at it in the upward direction, thereby increasing light output in the upward direction. Likewise, the rim can include a transparent material such as glass or a non-reflective, non-transparent low cost material such as epoxy. Furthermore, a reflective rim can be used regardless of whether it contacts or confines the encapsulant.

The encapsulant can be numerous transparent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

The lens can be numerous transparent or opaque materials and have various shapes and sizes. For instance, a glass lens with a hollow hemisphere dome can be mounted on the solder mask and spaced from the encapsulant, or a plastic lens with a solid hemisphere dome can be mounted on the encapsulant and spaced from the solder mask.

The conductive trace can include additional pads, terminals, vias and routing lines as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The dielectric layer, solder mask, plated contacts, encapsulant, rim and lens are generally desirable but may be omitted in some embodiments. For instance, if single-level signal routing is used then the dielectric layer may be omitted to reduce cost Likewise, if the encapsulant is transfer molded on the solder mask, laterally confined by the cavity or omitted then the rim can be omitted.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W.C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W.C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive, a single substrate and a single solder mask and then separated from one another. Likewise, numerous sets of heat spreaders and conductive traces that are each dedicated to a single semiconductor device can be simultaneously batch manufactured for each thermal board in the batch using a single metal plate, a single adhesive, a single substrate and a single solder mask.

For example, multiple recesses can be etched in the metal plate to form multiple posts and the base, then the non-solidified adhesive with openings corresponding to the posts can be mounted on the base such that each post extends through an opening, then the substrate (with a single conductive layer, a single dielectric layer and apertures corresponding to the posts) can be mounted on the adhesive such that each post extends through an opening into an aperture, then the base and the substrate can be moved towards one another by platens to force the adhesive into the gaps in the apertures between the posts and the substrate, then the adhesive can be cured and solidified, then the posts, the adhesive and the conductive layer can be grinded to form a lateral top surface, then the conductive layer can be etched to form the pads and the terminals corresponding to the posts, then the solder mask can be deposited on the structure and patterned to expose the posts, the pads and the terminals, then the posts and the base can be etched to form the cavities in the base and the adhesive, then the plated contact surface finish can be formed on the base, the pads and the terminals and then the base, the substrate, the adhesive and the solder mask can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, die attach paste portions can be deposited in the cavities on the base, then the chips can be placed in the cavities on the die attach paste portions, then the die attach paste portions can be simultaneously heated and hardened to provide the die attaches, then the chips can be wired bonded to the corresponding pads outside the cavities, then encapsulant portions can be deposited into the cavities on the chips and the wire bonds, then the encapsulant portions can be simultaneously heated and hardened to provide the encapsulants, then the lenses can be mounted over encapsulants and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the post is adjacent to the base regardless of whether the post is formed additively or subtractively.

The term "overlap" refers to above and extending within a periphery of an underlying element. Overlap includes extending inside and outside the periphery or residing within the periphery. For instance, the semiconductor device overlaps the base since an imaginary vertical line intersects the semiconductor device and the base, regardless of whether another element such as the die attach is between the semiconductor device and the base and is intersected by the line, and regardless of whether another imaginary vertical line intersects the base but not the semiconductor device (outside the periphery of the semiconductor device). Likewise, the adhesive overlaps the base and is overlapped by the pad, and the base is overlapped by the post. Likewise, the post overlaps and is within a periphery of the base. Moreover, overlap is synonymous with over and overlapped by is synonymous with under or beneath.

The term "contact" refers to direct contact. For instance, the dielectric layer contacts the pad but does not contact the post or the base.

The term "cover" refers to complete coverage in the upward, downward and/or lateral directions. For instance, the base covers the post in the downward direction but the post does not cover the base in the upward direction.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The terms "opening" and "aperture" refer to a through-hole and are synonymous. For instance, the post is exposed by the adhesive in the upward direction when it is inserted into the opening in the adhesive Likewise, the post is exposed by the substrate in the upward direction when it is inserted into the aperture in the substrate.

The term "inserted" refers to relative motion between elements. For instance, the post is inserted into the aperture regardless of whether the post is stationary and the substrate moves towards the base, the substrate is stationary and the post moves towards the substrate or the post and the substrate both approach the other. Furthermore, the post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the post is aligned with the aperture when the adhesive is mounted on the base, the substrate is mounted on the adhesive, the post is inserted into and aligned with the opening and the aperture is aligned with the opening regardless of whether the post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the post and the dielectric layer in the gap refers to the adhesive in the gap that contacts and is sandwiched between the post at the inner sidewall of the gap and the dielectric layer at the outer sidewall of the gap.

The term "above" refers to upward extension and includes adjacent and non-adjacent elements as well as overlapping and non-overlapping elements. For instance, the post extends above, is adjacent to, overlaps and protrudes from the base. Likewise, the cavity extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the post Likewise, the post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the cavity extends vertically above the base in the upward direction and the adhesive extends vertically below the pad in the downward direction regardless of whether the assembly is inverted and/or mounted on a heat sink. Likewise, the base extends "laterally" from the cavity in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED packages and chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A semiconductor chip assembly, comprising:
a semiconductor device;
an adhesive that includes an opening;
a heat spreader that includes a base; and
a conductive trace that includes a pad and a terminal;
wherein a cavity extends through the adhesive in the opening into the base, faces in the upward direction, has a diameter that decreases as it extends downwardly in the base and is covered by the base in the downward direction;
wherein the semiconductor device extends into the cavity and is covered by the cavity in the downward direction, is electrically connected to the pad and thereby electrically connected to the terminal, and is thermally connected to the base;
wherein the adhesive is mounted on and contacts and extends above the base, extends between the cavity and the pad, extends laterally from the opening to or beyond the terminal and is sandwiched between the base and the pad;
wherein the opening has a diameter that increases as it extends downwardly;
wherein the conductive trace is located outside the cavity; and
wherein the base extends below the semiconductor device and the pad.

2. The assembly of claim 1, wherein the semiconductor device is located within the cavity.

3. The assembly of claim 1, wherein the semiconductor device is an LED chip.

4. The assembly of claim 1, wherein the semiconductor device is electrically connected to the pad using a wire bond that extends outside the cavity and is thermally connected to the base using a die attach that is located within the cavity.

5. The assembly of claim 1, wherein the adhesive is located above the base.

6. The assembly of claim 1, wherein the adhesive has a flat top surface at the opening and above a bottom surface of the pad.

7. The assembly of claim 1, wherein the adhesive conformally coats a top surface of the base outside the cavity.

8. The assembly of claim 1, wherein the adhesive contacts the terminal.

9. The assembly of claim 1, wherein the adhesive extends laterally from the opening beyond the terminal.

10. The assembly of claim 1, wherein the adhesive extends to peripheral edges of the assembly.

11. The assembly of claim 1, wherein the cavity has a cut-off conical shape in the adhesive and a concave crater-like shape in the base.

12. The assembly of claim 1, wherein the cavity has an inverted mushroom-like shape that includes a stem in the adhesive and a dome in the base.

13. The assembly of claim 1, wherein the cavity has a maximum diameter at an interface between the adhesive and the base where the cavity extends laterally along a bottom surface of the adhesive to the base.

14. The assembly of claim 1, wherein the base covers the semiconductor device, the adhesive and the conductive trace in the downward direction and extends to peripheral edges of the assembly.

15. The assembly of claim 1, wherein the base and the terminal are the same metallic material, have the same thickness where closest to one another and are coplanar with one another at a surface that faces in the downward direction.

16. A semiconductor chip assembly, comprising:
a semiconductor device;
an adhesive that includes an opening;
a heat spreader that includes a base;
a substrate that includes a dielectric layer, wherein an aperture extends through the substrate; and
a conductive trace that includes a pad and a terminal;
wherein a cavity extends through the adhesive in the opening into the base, faces in the upward direction, extends into and below the aperture, has a diameter that decreases as it extends downwardly in the base and is covered by the base in the downward direction;
wherein the semiconductor device is located within the cavity, is mounted on the base, is electrically connected to the pad and thereby electrically connected to the terminal, and is thermally connected to the base;
wherein the adhesive is mounted on and extends above the base, contacts the base and the dielectric layer, extends into a gap in the aperture between the cavity and the substrate, extends across the dielectric layer in the gap, is sandwiched between the cavity and the dielectric layer in the gap and between the base and the dielectric layer outside the gap and extends laterally from the opening to or beyond the terminal and;
wherein the opening has a diameter that increases as it extends downwardly;
wherein the substrate is mounted on the adhesive and extends above the base;
wherein the conductive trace is located outside the cavity and the pad is mounted on and extends above the dielectric layer; and
wherein the base extends below the semiconductor device, the adhesive, the substrate and the pad.

17. The assembly of claim 16, wherein the semiconductor device is an LED chip.

18. The assembly of claim 16, wherein the semiconductor device is electrically connected to the pad using a wire bond that extends within and outside the cavity and is thermally connected to the base using a die attach that is located within the cavity.

19. The assembly of claim 16, wherein the adhesive is located above the base.

20. The assembly of claim 16, wherein the adhesive has a flat top surface at the opening and above a bottom surface of the pad.

21. The assembly of claim 16, wherein the adhesive fills the gap.

22. The assembly of claim 16, wherein the adhesive conformally coats a top surface of the base outside the cavity.

23. The assembly of claim 16, wherein the adhesive extends laterally from the opening beyond the terminal.

24. The assembly of claim 16, wherein the adhesive extends to peripheral edges of the assembly.

25. The assembly of claim 16, wherein the cavity has a cut-off conical shape in the adhesive and a concave crater-like shape in the base.

26. The assembly of claim 16, wherein the cavity has an inverted mushroom-like shape that includes a stem in the adhesive and a dome in the base.

27. The assembly of claim 16, wherein the cavity has a maximum diameter at an interface between the adhesive and the base where the cavity extends laterally along a bottom surface of the adhesive to the base.

28. The assembly of claim 16, wherein the base covers the semiconductor device, the adhesive, the substrate and the conductive trace in the downward direction and extends to peripheral edges of the assembly.

29. The assembly of claim 16, wherein the substrate is spaced from the cavity and the base and is a laminated structure that includes the pad.

30. The assembly of claim 16, wherein the base and the terminal are the same metallic material, have the same thickness where closest to one another and are coplanar with one another at a surface that faces in the downward direction.

31. A semiconductor chip assembly, comprising:
a semiconductor device;
an adhesive that includes an opening;
a heat spreader that includes a base;
a substrate that includes a dielectric layer, wherein an aperture extends through the substrate;
a conductive trace that includes a pad and a terminal; and
an encapsulant;
wherein a cavity extends through the adhesive in the opening into the base, faces in the upward direction, extends into and below the aperture, has a diameter that decreases as it extends downwardly from in the base and is covered by the base in the downward direction;
wherein the semiconductor device is located within the cavity, is mounted on the base, is electrically connected to the pad and thereby electrically connected to the terminal, and is thermally connected to the base;
wherein the adhesive is mounted on and extends above the base, extends into a gap in the aperture between the cavity and the substrate, extends across the dielectric layer in the gap, contacts and is sandwiched between the encapsulant and the dielectric layer in the gap, contacts and is sandwiched between the base and the dielectric layer outside the gap, is sandwiched between the base and the pad outside the gap, extends above a bottom surface of the pad, is overlapped by the pad, extends laterally from the opening to or beyond the terminal and extends to peripheral edges of the assembly;
wherein the substrate is mounted on the adhesive, extends above the base and is located outside the cavity;
wherein the conductive trace is located outside the cavity and the pad contacts and extends above the dielectric layer and overlaps the adhesive;
wherein the encapsulant extends into the cavity and covers the semiconductor device in the upward direction; and wherein the base extends below the semiconductor device, the adhesive, the encapsulant, the substrate and the pad.

32. The assembly of claim 31, wherein the semiconductor device is an LED chip, is electrically connected to the pad using a wire bond that extends within and outside the cavity and is thermally connected to the base using a die attach that is located within the cavity.

33. The assembly of claim 31, wherein the substrate is spaced from the cavity and the base, the adhesive fills the gap and conformally coats a top surface of the base outside the cavity, and the encapsulant contacts the semiconductor device and the adhesive in the cavity.

34. The assembly of claim 31, wherein the cavity has a cut-off conical shape in the adhesive and a concave crater-like shape in the base.

35. The assembly of claim 31, wherein the cavity has an inverted mushroom-like shape that includes a stem in the adhesive and a dome in the base and a maximum diameter at an interface between the adhesive and the base where the cavity extends laterally along a bottom surface of the adhesive to the base.

* * * * *